(12) United States Patent
Inoue et al.

(10) Patent No.: US 8,884,302 B2
(45) Date of Patent: Nov. 11, 2014

(54) DISPLAY DEVICE

(71) Applicant: Semiconductor Energy Laboratory Co., Ltd., Atsugi (JP)

(72) Inventors: Seiko Inoue, Isehara (JP); Hiroyuki Miyake, Atsugi (JP); Kouhei Toyotaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/777,106

(22) Filed: Feb. 26, 2013

(65) Prior Publication Data

US 2013/0168670 A1 Jul. 4, 2013

Related U.S. Application Data

(62) Division of application No. 13/228,495, filed on Sep. 9, 2011, now Pat. No. 8,405,092.

(30) Foreign Application Priority Data

Sep. 15, 2010 (JP) ................. 2010-207009

(51) Int. Cl.
| | | |
|---|---|---|
| H01L 29/04 | (2006.01) | |
| H01L 29/15 | (2006.01) | |
| H01L 31/036 | (2006.01) | |
| H01L 29/10 | (2006.01) | |
| H01L 31/0376 | (2006.01) | |
| H01L 31/20 | (2006.01) | |
| H01L 29/786 | (2006.01) | |
| H01L 27/12 | (2006.01) | |

(52) U.S. Cl.
CPC ........ *H01L 29/7869* (2013.01); *H01L 27/1251* (2013.01); *H01L 27/1225* (2013.01)

USPC 257/72; 257/59; 257/E29.117; 257/E29.151; 257/E29.202; 257/E29.273

(58) Field of Classification Search
USPC ...................... 257/59, 72, E29.117, E29.151, 257/E29.202, E29.273
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| CN | 101640219 | 2/2010 |
| EP | 1737044 A | 12/2006 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Ida M Soward
(74) *Attorney, Agent, or Firm* — Eric J. Robinson; Robinson Intellectual Property Law Office, P.C.

(57) ABSTRACT

A semiconductor device including a first gate electrode and a second gate electrode formed apart from each other over an insulating surface, an oxide semiconductor film including a region overlapping with the first gate electrode with a gate insulating film interposed therebetween, a region overlapping with the second gate electrode with the gate insulating film interposed therebetween, and a region overlapping with neither the first gate electrode nor the second gate electrode, and an insulating film covering the gate insulating film, the first gate electrode, the second gate electrode, and the oxide semiconductor film, and being in direct contact with the oxide semiconductor film is provided.

17 Claims, 13 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,628,349 B1 | 9/2003 | Takei et al. |
| 6,727,522 B1 | 4/2004 | Kawasaki et al. |
| 6,825,071 B2 | 11/2004 | Suzawa et al. |
| 6,884,666 B2 | 4/2005 | Takei et al. |
| 6,897,477 B2 | 5/2005 | Shibata et al. |
| 6,912,019 B2 | 6/2005 | Yoshikawa |
| 6,969,889 B2 | 11/2005 | Cho et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,115,487 B2 | 10/2006 | Kumomi et al. |
| 7,211,825 B2 | 5/2007 | Shih et al |
| 7,214,986 B2 | 5/2007 | Shibata et al. |
| 7,225,986 B2* | 6/2007 | Mizutani et al. ............... 235/454 |
| 7,268,485 B2 | 9/2007 | Tyan et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,405,432 B2 | 7/2008 | Adachi |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,508,037 B2* | 3/2009 | Kim et al. ............... 257/347 |
| 7,515,125 B2 | 4/2009 | Yamazaki et al. |
| 7,582,904 B2* | 9/2009 | Fujii et al. ............... 257/72 |
| 7,674,650 B2 | 3/2010 | Akimoto et al. |
| 7,732,819 B2 | 6/2010 | Akimoto et al. |
| 7,907,226 B2* | 3/2011 | Yang et al. ............... 349/43 |
| 7,915,102 B2* | 3/2011 | Hwang et al. ............... 438/160 |
| 7,932,521 B2* | 4/2011 | Akimoto et al. ............... 257/72 |
| 7,989,899 B2* | 8/2011 | Yin et al. ............... 257/402 |
| 8,129,717 B2 | 3/2012 | Yamazaki et al. |
| 8,188,477 B2 | 5/2012 | Miyairi et al. |
| 8,383,470 B2* | 2/2013 | Akimoto et al. ............... 438/161 |
| 8,502,220 B2* | 8/2013 | Yamazaki et al. ............... 257/43 |
| 8,536,579 B2* | 9/2013 | Sele et al. ............... 257/66 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0059986 A1 | 3/2003 | Shibata |
| 2003/0119230 A1 | 6/2003 | Chida et al. |
| 2003/0189401 A1 | 10/2003 | Kido et al. |
| 2003/0218222 A1 | 11/2003 | Wager et al. |
| 2004/0016927 A1 | 1/2004 | Takei et al. |
| 2004/0038446 A1 | 2/2004 | Takeda et al. |
| 2004/0127038 A1 | 7/2004 | Carcia et al. |
| 2004/0188688 A1 | 9/2004 | Muranaka |
| 2005/0017302 A1 | 1/2005 | Hoffman |
| 2005/0092998 A1* | 5/2005 | Yamazaki et al. ............... 257/72 |
| 2005/0199959 A1 | 9/2005 | Chiang et al. |
| 2005/0247940 A1 | 11/2005 | Shibata et al. |
| 2005/0259206 A1 | 11/2005 | Son |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0138416 A1 | 6/2006 | Park |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0200139 A1 | 8/2007 | Shibata et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0084650 A1 | 4/2010 | Yamazaki et al. |
| 2010/0092800 A1 | 4/2010 | Itagaki et al. |
| 2010/0109002 A1 | 5/2010 | Itagaki et al. |
| 2011/0062432 A1 | 3/2011 | Yamazaki et al. |
| 2011/0062434 A1* | 3/2011 | Eguchi et al. ............... 257/43 |
| 2011/0062436 A1 | 3/2011 | Yamazaki et al. |
| 2011/0062992 A1* | 3/2011 | Okazaki et al. ............... 326/102 |
| 2011/0115763 A1 | 5/2011 | Yamazaki et al. |
| 2011/0169005 A1* | 7/2011 | Saito et al. ............... 257/59 |
| 2012/0228607 A1 | 9/2012 | Miyairi et al. |
| 2013/0153910 A1* | 6/2013 | Yamazaki et al. ............... 257/59 |
| 2013/0328044 A1* | 12/2013 | Yamazaki et al. ............... 257/43 |
| 2013/0334525 A1* | 12/2013 | Miyairi et al. ............... 257/43 |

FOREIGN PATENT DOCUMENTS

| | | |
|---|---|---|
| EP | 2172977 A | 4/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| JP | 63-239117 A | 10/1988 |
|---|---|---|
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-196594 A | 7/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-229578 A | 8/2003 |
| JP | 2004-103957 A | 4/2004 |
| JP | 2004-273614 A | 9/2004 |
| JP | 2004-273732 A | 9/2004 |
| JP | 2005-322935 A | 11/2005 |
| JP | 2007-123861 | 5/2007 |
| JP | 2010-056539 | 3/2010 |
| JP | 2010-153828 A | 7/2010 |
| KR | 2001-0039847 A | 5/2001 |
| KR | 2010-0014164 A | 2/2010 |
| KR | 2010-0038145 A | 4/2010 |
| KR | 2011-0020287 A | 3/2011 |
| WO | WO-2004/114391 | 12/2004 |
| WO | WO-2010/058746 | 5/2010 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(Z_nO)_m$ (m = 3, 4, and 5), $InbGaO_3$, and $Ga_2O_3(Z_nO)_m$ (m = 7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randamness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase",", Physics Letters, Sep. 10, 1973, vol. 45A, No. 2, pp. 115-116.

Cho.D et al., "21.2:Al and Sn—Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide—Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

(56) References Cited

OTHER PUBLICATIONS

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of The SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,Or Zn] at Temperatures over 1000° C,", Journal of Solid State Chemistry, 1985, vol. 60, pp. 382-384.

Kitzerow.H et al., "Observation of Blue Phase in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review, A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et at "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO$_4$,", Phys. Rev. B (Physical Review, B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review, B), 2008, vol. 77, pp. 245202-1-245202-6.

Orita.M et al., "Amorphous transparent conductive oxide InGaO$_3$(ZnO)m (m<4):a Zn 4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered A12O3 Gate Insulator,", Appl. Phys. Lett. (Applied Physics Letters) , Sep. 1, 2003, vol. 83, No. 9, pp. 1755-1757.

International Search Report (Application No. PCT/JP2011/069855) Dated Dec. 13, 2011.

Written Opinion (Application No. PCT/JP2011/069855) Dated Dec. 13, 2011.

* cited by examiner

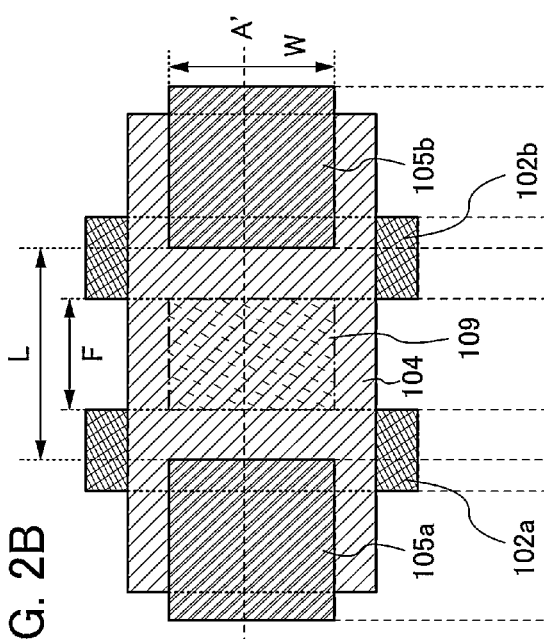
FIG. 2A
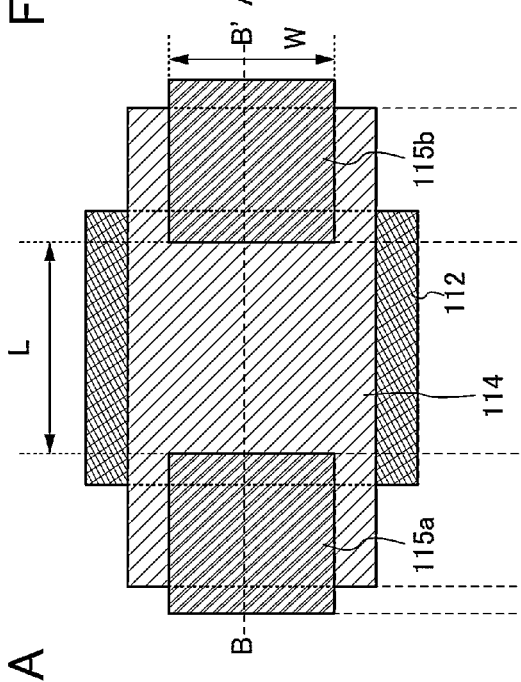
FIG. 2B
FIG. 2C

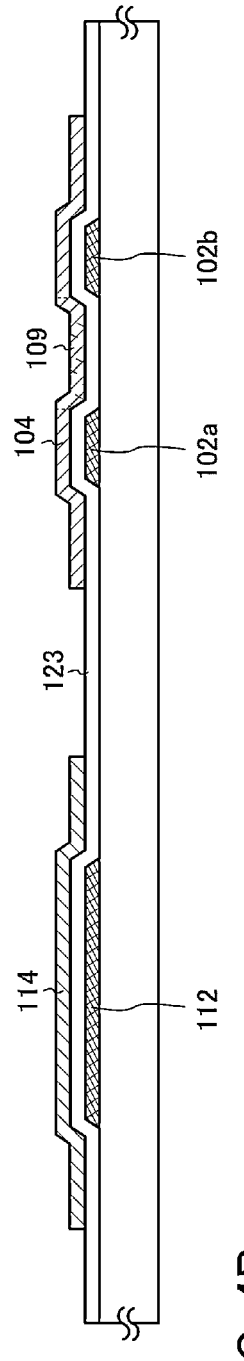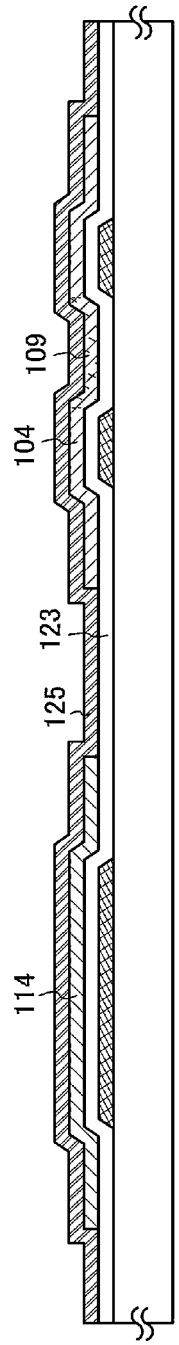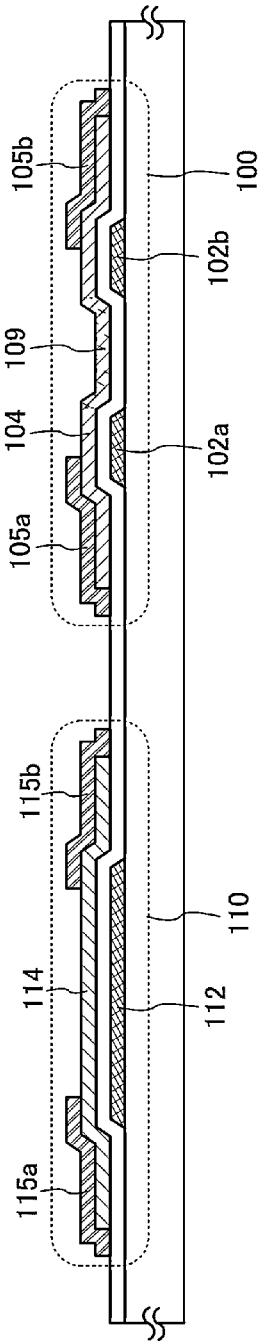

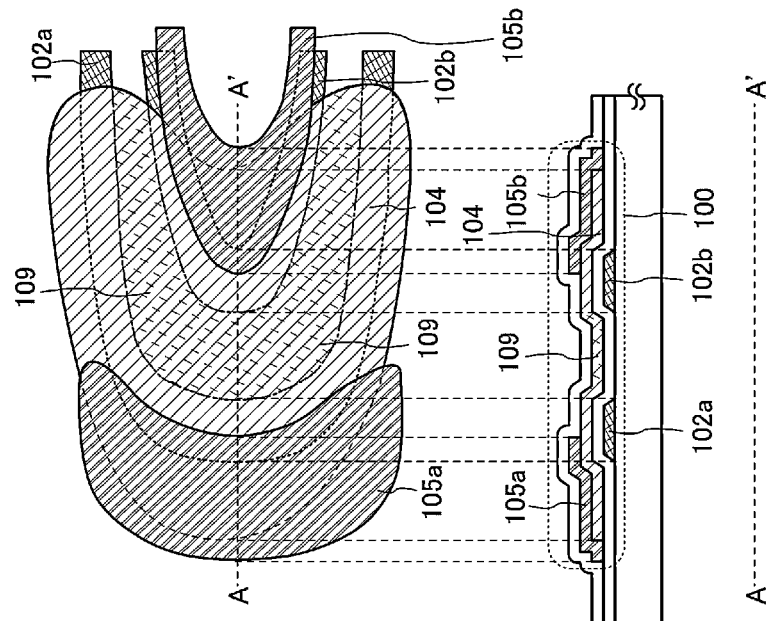
FIG. 10A
FIG. 10B
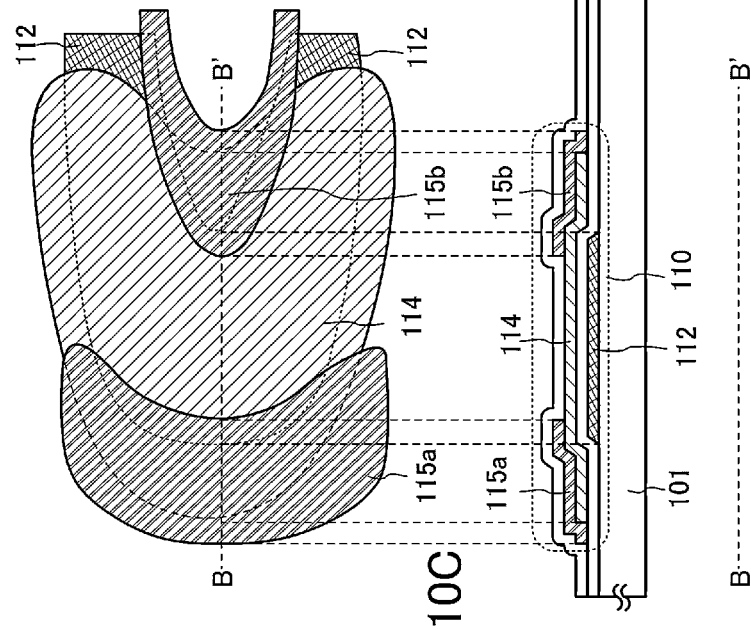
FIG. 10C

FIG. 12A  FIG. 12B
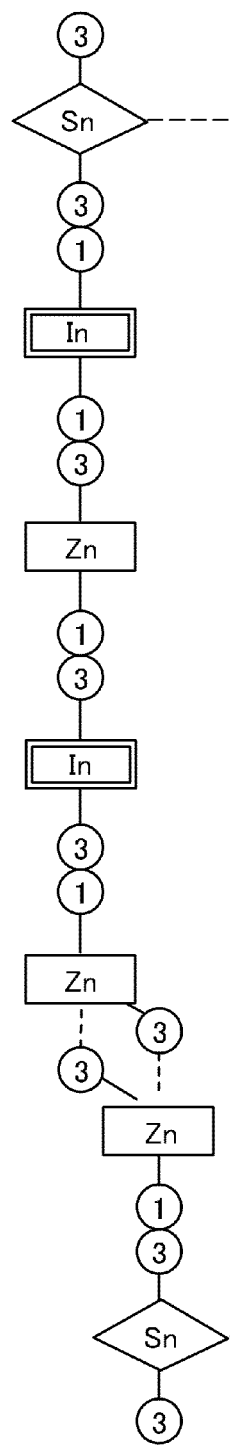
FIG. 12C
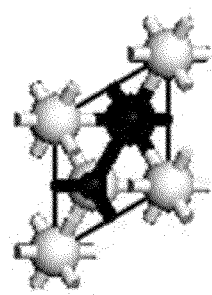
- In
- Sn
- Zn
- O

- In
- Ga
- Zn
- O

DISPLAY DEVICE

TECHNICAL FIELD

One embodiment of the disclosed invention relates to a semiconductor device, a display device, and manufacturing methods thereof.

BACKGROUND ART

In recent years, active matrix display devices (such as light-emitting display devices and electrophoretic display devices) in which a switching element or a current control element including a thin film transistor (TFT) is provided in each of display pixels arranged in matrix have been actively developed. As one of such light-emitting display devices, for example, an electroluminescent (EL) display device is given.

A technique where a transistor in which a channel formation region is formed in an oxide semiconductor film (hereinafter referred to as an "oxide semiconductor transistor") is formed over a light-transmitting substrate and used for a switching element or the like of a display device has been studied (see Patent Document 1).

As compared with a transistor in which a channel formation region is formed in an amorphous silicon film, an oxide semiconductor transistor has a high field effect mobility and thus has the advantage of a high on-state current. In addition, the oxide semiconductor transistor has the advantage that the off-state current is lower than that of the transistor in which a channel formation region is formed in an amorphous silicon film.

REFERENCE

Patent Document

[Patent Document 1] Japanese Published Patent Application No. 2010-56539

DISCLOSURE OF INVENTION

However, in the case where an oxide semiconductor transistor is used as a transistor provided in a pixel of a light-emitting display device, the on-state current of the oxide semiconductor transistor might be too high. In the transistor whose on-state current is too high, the drain current considerably varies even when the driving voltage of the transistor slightly varies. There is a problem in that the luminance of the light-emitting display device significantly varies when the drain current of the transistor considerably varies.

Accordingly, the on-state current of the oxide semiconductor transistor provided in a pixel needs to be adjusted. In order to decrease the on-state current of the oxide semiconductor transistor, the channel length of the oxide semiconductor transistor may be long.

However, when the channel length of the oxide semiconductor transistor is long, there is another problem in that the area occupied by the oxide semiconductor transistor is increased.

In a high-definition display device, the area occupied by one pixel is small.

Therefore, in the case where the transistor with a large occupied area is used in such a pixel with a small occupied area, the aperture ratio of the display device might be low.

In view of the above, an object of one embodiment of the disclosed invention is to provide an oxide semiconductor transistor in which the on-state current can be reduced without increasing the occupied area.

Another object of one embodiment of the disclosed invention is to provide a display device in which an oxide semiconductor transistor whose on-state current is reduced is used in a pixel without decreasing the aperture ratio.

Further, since an oxide semiconductor transistor has a high on-state current as described above, the oxide semiconductor transistor can be used for a driver circuit such as a gate driver or a source driver.

By manufacturing an oxide semiconductor transistor whose on-state current is low and an oxide semiconductor transistor whose on-state current is high over one substrate, the number of manufacturing steps of oxide semiconductor transistors can be reduced and thus the manufacturing cost can be lower.

In view of the above, another object of one embodiment of the disclosed invention is to manufacture an oxide semiconductor transistor whose on-state current is low and an oxide semiconductor transistor whose on-state current is high over one substrate.

Further, in the case where a display device is manufactured in such a manner that over one substrate, an oxide semiconductor transistor whose on-state current is low is manufactured in a pixel and an oxide semiconductor transistor whose on-state current is high is manufactured in a driver circuit, the number of manufacturing steps of the display device can be reduced and thus the manufacturing cost can be lower.

Accordingly, another object of one embodiment of the disclosed invention is to provide a display device in which over one substrate, an oxide semiconductor transistor whose on-state current is low is used in a pixel and an oxide semiconductor transistor whose on-state current is high is used in a driver circuit.

In an oxide semiconductor transistor, a first gate electrode and a second gate electrode are provided on a source electrode side and on a drain electrode side, respectively.

Thus, between a region where an oxide semiconductor film and the first gate electrode overlap with each other and a region where the oxide semiconductor film and the second gate electrode overlap with each other, a region where the oxide semiconductor film and the gate electrodes do not overlap with each other is formed. In this specification, a region of the oxide semiconductor film which does not overlap with the gate electrode is referred to as an $L_{off}$ region. The on-state current of the oxide semiconductor transistor can be reduced by forming the $L_{off}$ region.

The thus manufactured oxide semiconductor transistor is used in a pixel, whereby the on-state current can be reduced without increasing the area occupied by the oxide semiconductor transistor.

Moreover, in a display device including a pixel in which the oxide semiconductor transistor whose on-state current is reduced is used, decrease in aperture ratio can be suppressed.

The on-state current of the oxide semiconductor transistor is high as described above in the case where an $L_{off}$ region is not formed. The oxide semiconductor transistor whose on-state current is low and the oxide semiconductor transistor whose on-state current is high can be manufactured over one substrate.

By manufacturing an oxide semiconductor transistor whose on-state current is low and an oxide semiconductor transistor whose on-state current is high over one substrate in the above manner, the number of manufacturing steps can be reduced and thus the manufacturing cost can be lower.

An oxide semiconductor transistor in which an $L_{off}$ region is not formed (the oxide semiconductor transistor whose on-state current is high) is used as a transistor included in a driver circuit, and an oxide semiconductor transistor in which an $L_{off}$ region is formed (the oxide semiconductor transistor whose on-state current is low) is used as a transistor included in a pixel, whereby the oxide semiconductor transistor for the pixel and the oxide semiconductor transistor for the driver circuit can be manufactured over one substrate.

In the case where a display device is manufactured in the above manner in which over one substrate, an oxide semiconductor transistor whose on-state current is low is manufactured in a pixel and an oxide semiconductor transistor whose on-state current is high is manufactured in a driver circuit, the number of manufacturing steps of the display device can be reduced and thus the manufacturing cost can be lower.

One embodiment of the disclosed invention is a semiconductor device including: a first gate electrode and a second gate electrode formed apart from each other over an insulating surface; an oxide semiconductor film including a region overlapping with the first gate electrode with a gate insulating film interposed therebetween, a region overlapping with the second gate electrode with the gate insulating film interposed therebetween, and a region overlapping with neither the first gate electrode nor the second gate electrode; one of a source electrode and a drain electrode overlapping with a part of the first gate electrode and a part of the oxide semiconductor film; the other of the source electrode and the drain electrode overlapping with a part of the second gate electrode and a part of the oxide semiconductor film; and an insulating film covering the gate insulating film, the first gate electrode, the second gate electrode, the oxide semiconductor film, the source electrode, and the drain electrode. The insulating film is in direct contact with the oxide semiconductor film.

One embodiment of the disclosed invention is a semiconductor device including a first transistor and a second transistor over an insulating surface. The first transistor includes: a first gate electrode and a second gate electrode formed apart from each other over the insulating surface; a first oxide semiconductor film comprising a region overlapping with the first gate electrode with a gate insulating film interposed therebetween, a region overlapping with the second gate electrode with the gate insulating film interposed therebetween, and a region overlapping with neither the first gate electrode nor the second gate electrode; one of a first source electrode and a first drain electrode overlapping with a part of the first gate electrode and a part of the first oxide semiconductor film; the other of the first source electrode and the first drain electrode overlapping with a part of the second gate electrode and a part of the first oxide semiconductor film; and an insulating film covering the gate insulating film, the first gate electrode, the second gate electrode, the first oxide semiconductor film, the first source electrode, and the first drain electrode. The insulating film is in direct contact with the first oxide semiconductor film. The second transistor over the insulating surface includes: a third gate electrode over the insulating surface; a second oxide semiconductor film overlapping with the third gate electrode with the gate insulating film interposed therebetween; a second source electrode overlapping with a part of the third gate electrode and a part of the second oxide semiconductor film and a second drain electrode overlapping with a part of the third gate electrode and a part of the second oxide semiconductor film; and the insulating film covering the gate insulating film, the third gate electrode, the second oxide semiconductor film, the second source electrode, and the second drain electrode. The insulating film is in direct contact with the second oxide semiconductor film.

One embodiment of the disclosed invention is a display device including, over an insulating surface, a driver circuit for driving a pixel portion, and the pixel portion including a plurality of pixels. Each of the plurality of pixels includes a light-emitting element, a switching element for controlling on/off of a current control element, and the current control element for controlling a current of the light-emitting element. The current control element includes a first gate electrode and a second gate electrode formed apart from each other over the insulating surface; an oxide semiconductor film including a region overlapping with the first gate electrode with a gate insulating film interposed therebetween, a region overlapping with the second gate electrode with the gate insulating film interposed therebetween, and a region overlapping with neither the first gate electrode nor the second gate electrode; one of a source electrode and a drain electrode overlapping with a part of the first gate electrode and a part of the oxide semiconductor film; the other of the source electrode and the drain electrode overlapping with a part of the second gate electrode and a part of the oxide semiconductor film; and an insulating film covering the gate insulating film, the first gate electrode, the second gate electrode, the oxide semiconductor film, the source electrode, and the drain electrode. The insulating film is in direct contact with the oxide semiconductor film.

One embodiment of the disclosed invention is a display device including, over an insulating surface, a pixel portion including a plurality of pixels and a driver circuit for driving the pixel portion. Each of the plurality of pixels includes a first transistor. The first transistor includes a first gate electrode and a second gate electrode formed apart from each other over the insulating surface; a first oxide semiconductor film including a region overlapping with the first gate electrode with a gate insulating film interposed therebetween, a region overlapping with the second gate electrode with the gate insulating film interposed therebetween, and a region overlapping with neither the first gate electrode nor the second gate electrode; one of a first source electrode and a first drain electrode overlapping with a part of the first gate electrode and a part of the first oxide semiconductor film; the other of the first source electrode and the first drain electrode overlapping with a part of the second gate electrode and a part of the first oxide semiconductor film; and an insulating film covering the gate insulating film, the first gate electrode, the second gate electrode, the first oxide semiconductor film, the first source electrode, and the first drain electrode. The insulating film is in direct contact with the first oxide semiconductor film. The driver circuit includes a second transistor. The second transistor includes a third gate electrode over the insulating surface; a second oxide semiconductor film overlapping with the third gate electrode with the gate insulating film interposed therebetween; a second source electrode overlapping with a part of the third gate electrode and a part of the second oxide semiconductor film and a second drain electrode overlapping with a part of the third gate electrode and a part of the second oxide semiconductor film; and the insulating film covering the gate insulating film, the third gate electrode, the second oxide semiconductor film, the second source electrode, and the second drain electrode. The insulating film is in direct contact with the second oxide semiconductor film.

In one embodiment of the disclosed invention, each of the plurality of pixels includes a light-emitting element.

One embodiment of the disclosed invention is a display device including, over an insulating surface, a pixel portion including a plurality of pixels and a driver circuit for driving the pixel portion. Each of the plurality of pixels includes a light-emitting element; a switching element for controlling on/off of a current control element; and the current control element for controlling a current of the light-emitting element. The current control element includes a first transistor. The first transistor includes a first gate electrode and a second gate electrode formed apart from each other over the insulating surface; a first oxide semiconductor film comprising a region overlapping with the first gate electrode with a gate insulating film interposed therebetween, a region overlapping with the second gate electrode with the gate insulating film interposed therebetween, and a region overlapping with neither the first gate electrode nor the second gate electrode; one of a first source electrode and a first drain electrode overlapping with a part of the first gate electrode and a part of the first oxide semiconductor film; the other of the first source electrode and the first drain electrode overlapping with a part of the second gate electrode and a part of the first oxide semiconductor film; and an insulating film covering the gate insulating film, the first gate electrode, the second gate electrode, the first oxide semiconductor film, the first source electrode, and the first drain electrode. The insulating film is in direct contact with the first oxide semiconductor film. The driver circuit includes a second transistor. The second transistor includes a third gate electrode over the insulating surface; a second oxide semiconductor film overlapping with the third gate electrode with the gate insulating film interposed therebetween; a second source electrode overlapping with a part of the third gate electrode and a part of the second oxide semiconductor film and a second drain electrode overlapping with a part of the third gate electrode and a part of the second oxide semiconductor film; and the insulating film covering the gate insulating film, the third gate electrode, the second oxide semiconductor film, the second source electrode, and the second drain electrode. The insulating film is in direct contact with the second oxide semiconductor film.

In one embodiment of the disclosed invention, the driver circuit is a source driver or a gate driver.

According to one embodiment of the disclosed invention, an oxide semiconductor transistor in which the on-state current can be reduced without increasing the occupied area can be provided.

According to one embodiment of the disclosed invention, an oxide semiconductor transistor whose on-state current is reduced is used in a pixel without decreasing the aperture ratio can be provided.

According to one embodiment of the disclosed invention, an oxide semiconductor transistor whose on-state current is low and an oxide semiconductor transistor whose on-state current is high over one substrate can be manufactured.

By manufacturing an oxide semiconductor transistor whose on-state current is low and an oxide semiconductor transistor whose on-state current is high over one substrate, the number of manufacturing steps of oxide semiconductor transistors can be reduced and thus the manufacturing cost can be lower.

According to one embodiment of the disclosed invention, a display device in which over one substrate, an oxide semiconductor transistor whose on-state current is low is used in a pixel and an oxide semiconductor transistor whose on-state current is high is used in a driver circuit can be provided.

An oxide semiconductor transistor whose on-state current is low is manufactured in a pixel and an oxide semiconductor transistor whose on-state current is high is manufactured in a driver circuit, the number of manufacturing steps of a display device can be reduced and thus the manufacturing cost can be lower.

BRIEF DESCRIPTION OF DRAWINGS

In the accompanying drawings:

FIGS. 2A and 2B are top views of a semiconductor device and FIG. 2C is a cross-sectional view thereof;

FIGS. 4A to 4C are cross-sectional views illustrating the manufacturing process of a semiconductor device;

FIGS. 10A and 10B are top views of a semiconductor device and FIG. 10C is a cross-sectional view thereof;

FIGS. 12A to 12C are views illustrating structures of oxide materials; and

BEST MODE FOR CARRYING OUT THE INVENTION

Figure 1A:
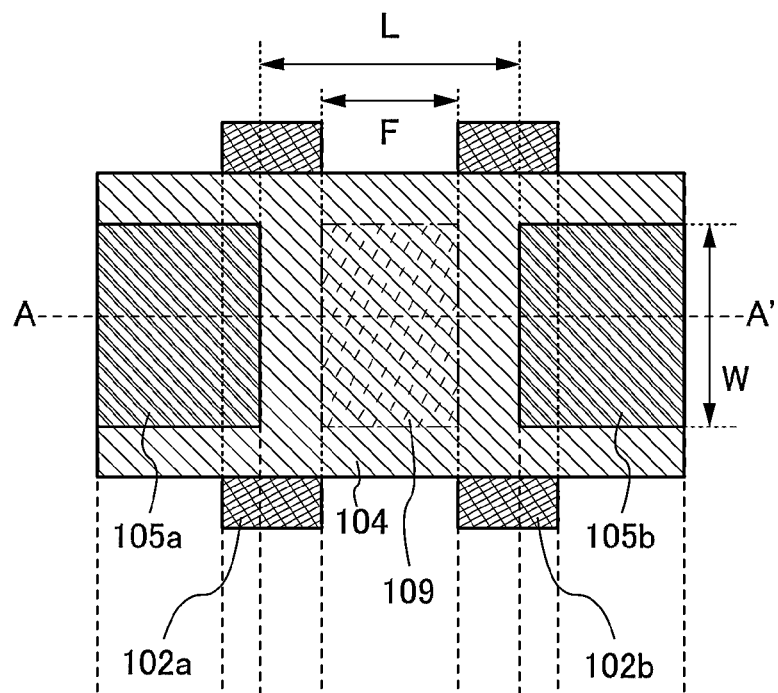
FIG. 1A is a top view of a semiconductor device and FIG. 1B is a cross-sectional view thereof.

Embodiments of the invention disclosed in this specification will be hereinafter described with reference to the accompanying drawings. Note that the invention disclosed in this specification can be carried out in a variety of different modes, and it is easily understood by those skilled in the art that the modes and details can be changed in various ways without departing from the spirit and scope of the invention disclosed in this specification. Therefore, the present invention is not construed as being limited to description of the embodiments. Note that in the drawings described below, the same portions or portions having similar functions are denoted by the same reference numerals, and description thereof is not repeated.

Note that in the invention disclosed in this specification, a semiconductor device refers to an element or a device which functions by utilizing a semiconductor and includes, in its category, an electric device including an electronic circuit, a display device, a light-emitting device, and the like and an electronic appliance on which the electric device is mounted.

<Oxide Semiconductor Transistor Having an $L_{off}$ Region>

Figure 1B:
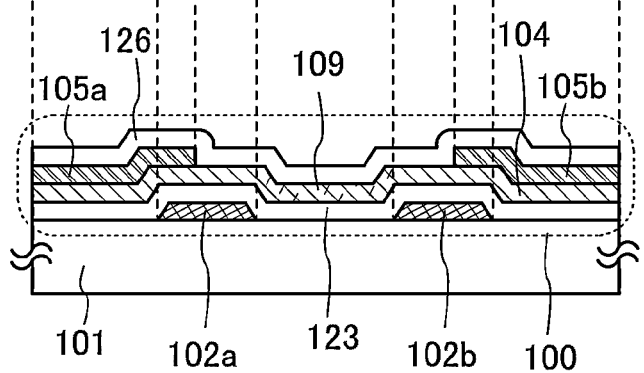

An oxide semiconductor transistor 100 illustrated in FIG. 1B is formed over a substrate 101 having an insulating surface. The oxide semiconductor transistor 100 includes a gate electrode 102a serving as a first gate electrode, a gate electrode 102b serving as a second gate electrode, a gate insulating film 123, an oxide semiconductor film 104 serving as a first oxide semiconductor film, an electrode 105a serving as one of a source electrode and a drain electrode, and an electrode 105b serving as the other of the source electrode and the drain electrode.

As the substrate 101, the following can be used: an alkali-free glass substrate manufactured by a fusion method or a floating method, such as a barium borosilicate glass substrate, an aluminoborosilicate glass substrate, or an aluminosilicate glass substrate; a ceramic substrate; a plastic substrate having heat resistance sufficient to withstand a process temperature of this manufacturing process; or the like. Alternatively, a metal substrate such as a stainless steel alloy substrate the surface of which is provided with an insulating film may be used.

The gate electrode 102a and the gate electrode 102b are formed apart from each other over the substrate 101. The gate insulating film 123 is provided between the gate electrode 102a and the gate electrode 102b.

Each of the gate electrode 102a serving as the first gate electrode and the gate electrode 102b serving as the second gate electrode is a conductive film containing any of titanium (Ti), molybdenum (Mo), chromium (Cr), tantalum (Ta), tungsten (W), aluminum (Al), silver (Ag), gold (Au), and copper (Cu).

Each of the gate electrode 102a and the gate electrode 102b may have a single layer structure of a conductive film containing any of the above elements or a stacked structure of conductive films containing any of the above elements.

Note that a semiconductor film or a conductive film is formed over the gate electrode 102a and the gate electrode 102b. In order to prevent disconnection of the semiconductor film or the conductive film, end portions of the gate electrode 102a and the gate electrode 102b are preferably processed so that the gate electrode 102a and the gate electrode 102b each have a taper shape.

The gate insulating film 123 is formed to cover the gate electrode 102a and the gate electrode 102b.

The gate insulating film 123 may have a single layer structure of a silicon oxide film, a silicon oxynitride film, a silicon nitride oxide film, or a silicon nitride film, or may have a stacked structure of any of these films.

In this embodiment, a silicon oxynitride film refers to a film that contains more oxygen (O) than nitrogen (N) and, in the case where measurements are performed using Rutherford backscattering spectrometry (RBS) and hydrogen forward scattering (HFS), contains oxygen (O), nitrogen (N), silicon (Si), and hydrogen (H) at concentrations ranging from 55 at. % to 70 at. %, from 0.5 at. % to 15 at. %, from 25 at. % to 35 at. %, and from 0.1 at. % to 10 at. %, respectively.

Further, a silicon nitride oxide film refers to a film that contains more nitrogen (N) than oxygen (O) and contains oxygen (O), nitrogen (N), silicon (Si), and hydrogen (H) at concentrations ranging from 5 at. % to 30 at. %, 20 at. % to 55 at. %, 25 at. % to 35 at. %, and 10 at. % to 30 at. %, respectively.

Note that percentages of nitrogen (N), oxygen (O), silicon (Si), and hydrogen (H) fall within the ranges given above, where the total number of atoms contained in the silicon oxynitride or the silicon nitride oxide is defined as 100 at. %.

For the gate insulating film 123, an oxide of aluminum (Al), yttrium (Y), magnesium (Mg), or hafnium (Hf); a nitride of aluminum (Al), yttrium (Y), magnesium (Mg), or hafnium (Hf); an oxynitride of aluminum (Al), yttrium (Y), magnesium (Mg), or hafnium (Hf); or a nitride oxide of aluminum (Al), yttrium (Y), magnesium (Mg), or hafnium (Hf) can be used. Alternatively, a compound including at least two kinds of the oxide, the nitride, the oxynitride, and the nitride oxide can be used.

The oxide semiconductor transistor 100 includes, over the gate insulating film 123, the oxide semiconductor film 104 in which a channel formation region is formed. Since the oxide semiconductor transistor 100 includes the oxide semiconductor film 104 that has a continuous surface, there is no barrier to carrier transfer, which is preferable.

Thus, between a region where the oxide semiconductor film 104 and the first gate electrode 102a overlap with each other and a region where the oxide semiconductor film 104 and the second gate electrode 102b overlap with each other, a region where the oxide semiconductor film 104 and the gate electrodes do not overlap with each other is formed. In this specification, the region of the oxide semiconductor film 104 which overlaps with neither the first gate electrode 102a nor the second gate electrode 102b is referred to as an $L_{off}$ region 109. The on-state current of the oxide semiconductor transistor can be reduced by forming the $L_{off}$ region.

As the oxide semiconductor film 104, a thin film of an oxide semiconductor described below is used.

An oxide semiconductor used in this example preferably contains at least indium (In) or zinc (Zn). In particular, In and Zn are preferably contained. As a stabilizer for reducing change in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component, in which there is no particular limitation on the ratio of In:Ga:Zn. In addition to In, Ga, and Zn, a metal element may be contained.

As the oxide semiconductor, a material expressed by a chemical formula, $InMO_3(ZnO)_m$ (m>0, m is not an integer) may be used. Here, M represents one or more metal elements selected from Ga, Fe, Mn, or Co. Alternatively, as the oxide semiconductor, a material expressed by a chemical formula, $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm.

Note that the average surface roughness ($R_a$) is obtained by expanding, into three dimensions, center line average roughness that is defined by JIS B 0601 so as to be able to apply it to a measurement surface. The $R_a$ can be expressed as an "average value of the absolute values of deviations from a reference surface to a designated surface" and is defined by the following formula.

$$Ra = \frac{1}{S_0}\int_{y_1}^{y_2}\int_{x_1}^{x_2}|f(x,y)-Z_0|dxdy \qquad \text{[FORMULA 1]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

Here, as the oxide semiconductor having crystallinity, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 11A to 11E, FIGS. 12A to 12C, and FIGS. 13A to 13C. In FIGS. 11A to 11E, FIGS. 12A to 12C, and FIGS. 13A to 13C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 11A to 11E, O surrounded by a circle represents tetracoodianate O and O surrounded by a double circle represents tricoodenate O.

Figure 11A:
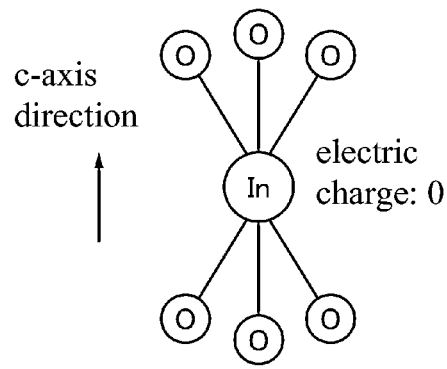
FIGS. 11A to 11E are views illustrating structures of oxide materials.

FIG. 11A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 11A is actually an octahedral structure, but is illustrated as a planar structure for simplicity. Note that three tetracoordinate O atoms exist in each of an upper half and a lower half in FIG. 11A. In the small group illustrated in FIG. 11A, electric charge is 0.

Figure 11D:
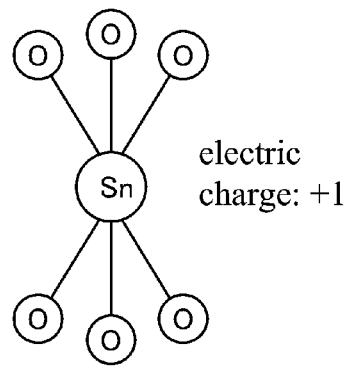
Figure 11B:
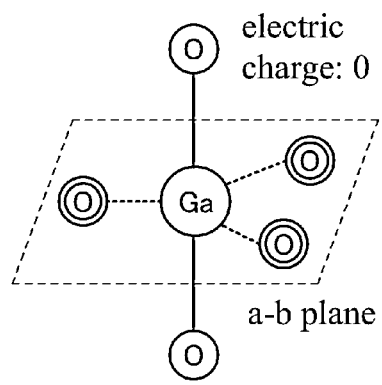

FIG. 11B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane.

One tetracoordinate O atom exists in each of an upper half and a lower half in FIG. 11B. An In atom can also have the structure illustrated in FIG. 11B because an In atom can have five ligands. In the small group illustrated in FIG. 11B, electric charge is 0.

Figure 11E:
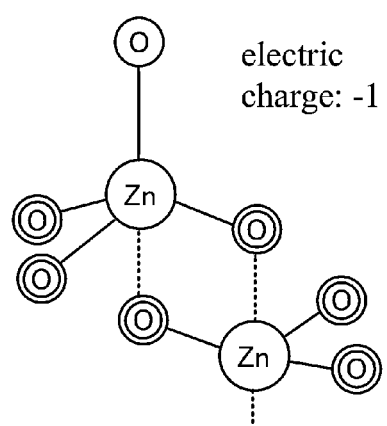
Figure 11C:
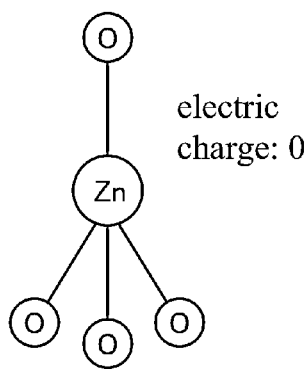

FIG. 11C illustrates a structure including one tetracoordinate Zn atom and four tetracoordinate O atoms proximate to the Zn atom. In FIG. 11C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 11C. In the small group illustrated in FIG. 11C, electric charge is 0.

FIG. 11D illustrates a structure including one hexacoordinate Sn atom and six tetracoordinate O atoms proximate to the Sn atom. In FIG. 11D, three tetracoordinate O atoms exist in each of an upper half and a lower half. In the small group illustrated in FIG. 11D, electric charge is +1.

FIG. 11E illustrates a small group including two Zn atoms. In FIG. 11E, one tetracoordinate O atom exists in each of an upper half and a lower half. In the small group illustrated in FIG. 11E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 11A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 12A illustrates a model of a medium group included in a layered structure of an In—Sn—Zn—O-based material. FIG. 12B illustrates a large group including three medium groups. Note that FIG. 12C illustrates an atomic arrangement in the case where the layered structure in FIG. 12B is observed from the c-axis direction.

In FIG. 12A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 12A, one tetracoordinate O atom existing in each of an upper half and a lower half with respect to an In atom is denoted by circled 1. FIG. 12A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 12A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 11E can be given. For example, with one small group including two Zn atoms, electric charge of one small group including a Sn atom can be cancelled, so that the total electric charge of the layered structure can be 0.

When the large group illustrated in FIG. 12B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$, (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 13A:
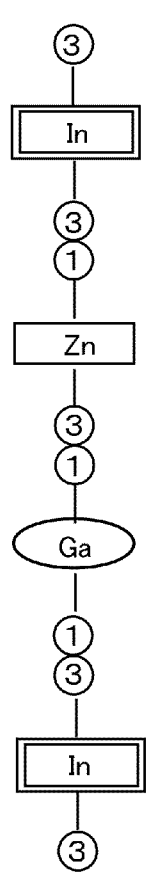
FIGS. 13A to 13C are views illustrating structures of oxide materials.

As an example, FIG. 13A illustrates a model of a medium group included in a layered structure of an In—Ga—Zn—O-based material.

In the medium group included in the layered structure of the In—Ga—Zn—O-based material in FIG. 13A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 13B:
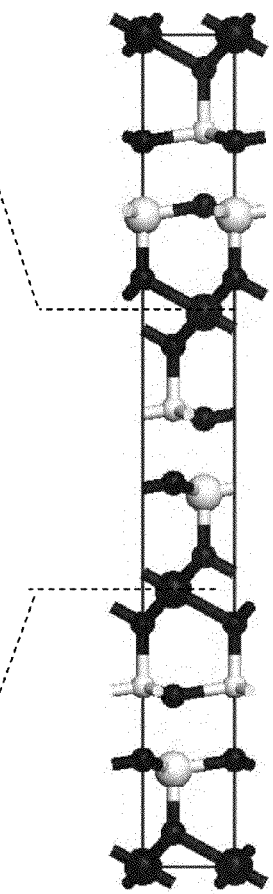
Figure 13C:
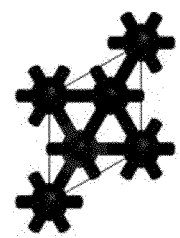

FIG. 13B illustrates a large group including three medium groups. Note that FIG. 13C illustrates an atomic arrangement in the case where the layered structure in FIG. 13B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 13A but also a medium group in which the arrangement of the In atom, the Ga atom, and the Zn atom is different from that in FIG. 13A.

Further, an In—Sn—Zn-based oxide can be referred to as ITZO. An oxide target which has a composition ratio of In:Sn:Zn=1:2:2, 2:1:3, 1:1:1, 20:45:35, or the like in an atomic ratio is used.

Note that in the oxide semiconductor film in this specification, the concentration of sodium (Na) measured by a secondary ion mass spectroscopy (SIMS) method is $5\times10^{16}$ cm$^{-3}$ or lower, preferably $1\times10^{16}$ cm$^{-3}$ or lower, further preferably $1\times10^{15}$ cm$^{-3}$ or lower. In the oxide semiconductor film in this specification, the concentration of lithium (Li) measured by SIMS is $5\times10^{15}$ cm$^{-3}$ or lower, preferably $1\times10^{15}$ cm$^{-3}$ or lower. In the oxide semiconductor film in this specification, the concentration of potassium (K) measured by SIMS is $5\times10^{15}$ cm$^{-3}$ or lower, preferably $1\times10^{15}$ cm$^{-3}$ or lower.

In the oxide semiconductor film, in the case where the concentration of an alkali metal such as sodium (Na), lithium (Li), or potassium (K) or an alkaline earth metal is high, deterioration in transistor characteristics and variation in transistor characteristics might be generated. Therefore, in order to suppress such deterioration in transistor characteristics and variation in transistor characteristics, the concentrations of the alkali metal and the alkaline earth metal in the oxide semiconductor film preferably fall within the ranges given above.

In particular, in the case where the insulating film in contact with the oxide semiconductor film is an oxide insulating film, sodium (Na) diffuses into the insulating film and becomes sodium ions (Na$^+$). In addition, sodium (Na) may cut the bond between metal and oxygen or may enter the bond in the oxide semiconductor film.

In the case where sodium (Na) becomes sodium ions (Na$^+$) in the insulating film, in the case where sodium (Na) cuts the bond between metal and oxygen in the oxide semiconductor film, or in the case where sodium (Na) enters the bond in the oxide semiconductor film, there is a risk in that transistor characteristics deteriorate (e.g., the transistor becomes normally-on (the shift of a threshold voltage to a negative side) or the mobility is decreased). Further, such behavior of sodium (Na) causes variation in transistor characteristics.

The deterioration in transistor characteristics and variation in transistor characteristics due to an alkali metal and an alkaline earth metal are significant particularly in the case where the hydrogen concentration in the oxide semiconductor film is sufficiently low. Therefore, the concentration of an alkali metal is preferably set to the above value in the case where the hydrogen concentration in the oxide semiconductor film is $5\times10^{19}$ cm$^{-3}$ or lower, particularly $5\times10^{18}$ cm$^{-3}$ or lower.

The electrode 105a serving as one of the source electrode and the drain electrode overlaps with part of the gate electrode 102a and part of the oxide semiconductor film 104. The electrode 105b serving as the other of the source electrode and the drain electrode overlaps with part of the gate electrode 102b and part of the oxide semiconductor film 104.

For each of the electrode 105a and the electrode 105b, a conductive film containing an element selected from aluminum (Al), chromium (Cr), tantalum (Ta), titanium (Ti), molybdenum (Mo), and tungsten (W); an alloy film containing any of the above elements; an alloy film containing any of the above elements in combination; or the like is used.

Note that a single aluminum (Al) film has disadvantages such as low heat resistance and a tendency to corrosion. Therefore, when aluminum (Al) is used for the electrode 105a and the electrode 105b, aluminum (Al) is used in combination with a conductive material having heat resistance.

As a conductive material having heat resistance which is used in combination with aluminum (Al), a material containing an element selected from titanium (Ti), tantalum (Ta), tungsten (W), molybdenum (Mo), chromium (Cr), neodymium (Nd), and scandium (Sc); or an alloy material containing any of the above elements; an alloy material containing any of the above elements in combination; or a nitride containing any of the above elements is used.

An insulating film 126 is formed to cover the gate electrode 102a serving as the first gate electrode, the gate electrode 102b serving as the second gate electrode, the gate insulating film 123, the oxide semiconductor film 104, the electrode 105a serving as one of a source electrode and a drain electrode, and the electrode 105b serving as the other of the source electrode and the drain electrode. The insulating film 126 is an insulating film that is formed in direct contact with the oxide semiconductor film 104, and serves as a protection film of the oxide semiconductor film 104.

In a manner similar to that of the gate insulating film 123, the insulating film 126 may have a single layer structure of a silicon oxide film, a silicon oxynitride film, a silicon nitride oxide film, or a silicon nitride film, or may have a stacked structure of any of these films. Note that the protective film is provided to prevent entry of contaminant impurities such as an organic substance, metal, and moisture existing in the air and is preferably a dense film.

FIG. 1A is a top view of the oxide semiconductor transistor 100, and FIG. 1B is a cross-sectional view taken along A-A' in FIG. 1A.

A region in the oxide semiconductor film 104 between the electrode 105a and the electrode 105b (the source electrode and the drain electrode) corresponds to a channel formation region. Thus, as illustrated in FIG. 1A, a distance between an edge of the electrode 105a and an edge of the electrode 105b corresponds to a channel length L. Further, the length of one side, which perpendicular to the channel length, of the electrode 105a or the electrode 105b corresponds to a channel width W.

Accordingly, a region where the oxide semiconductor film 104 overlaps with neither the gate electrode 102a nor the gate electrode 102b in the channel formation region is the $L_{off}$ region 109. A length of the $L_{off}$ region 109 in the channel length direction is a length F.

When the length F that is the length of the $L_{off}$ region 109 in the channel length direction is too short, the effect of reducing on-state current cannot be obtained, while when the length F is too long, resistance of the channel formation region is increased. Therefore, the length F that is the length of the $L_{off}$ region 109 in the channel length direction is preferably greater than or equal to 1 μm and less than or equal to 20 μm.

The on-state current of the oxide semiconductor transistor 100 can be reduced by forming the $L_{off}$ region 109. Therefore, the oxide semiconductor transistor 100 in which the on-state current can be reduced without increasing the occupied area can be provided.

The oxide semiconductor transistor 100 whose on-state current is reduced by the formation of the $L_{off}$ region 109 in such a manner can be used in a pixel of a display device. The display device in which the oxide semiconductor transistor 100 is used in a pixel will be described later.

Note that although a bottom-gate transistor is described as the oxide semiconductor transistor 100 in this embodiment, one embodiment of the disclosed invention is not limited thereto. A top-gate oxide semiconductor transistor is also preferable as long as the top-gate oxide semiconductor transistor includes the first gate electrode and the second gate electrode formed apart from each other, and a region that overlaps with the first gate electrode and the second gate electrode with the gate insulating film interposed therebetween and a region that overlaps with neither the first gate electrode nor the second gate electrode because the effect of reducing the on-state current can be obtained.

<Oxide Semiconductor Transistor without $L_{off}$ Region and Oxide Semiconductor Transistor with $L_{off}$ Region Over One Substrate>

FIGS. 2A and 2B are top views illustrating an oxide semiconductor transistor 110 in which an $L_{off}$ region is not formed and the oxide semiconductor transistor 100 in which an $L_{off}$ region 109 is formed, and FIG. 2C is a cross-sectional view thereof.

A cross-sectional view taken along A-A' in FIG. 2B and a cross-sectional view taken along B-B' in FIG. 2A are illustrated in FIG. 2C. Note that FIG. 2B is the same as FIG. 1A, and the cross-sectional view of FIG. 2C taken along A-A' is the same as FIG. 1B. The detailed description of the oxide semiconductor transistor 100 illustrated in FIGS. 2B and 2C is the same as the above-mentioned description, and thus omitted.

The oxide semiconductor transistor 110 illustrated in FIGS. 2A and 2C is formed over the substrate 101 having an insulating surface.

The oxide semiconductor transistor 110 is formed over the substrate 101, and includes a gate electrode 112 serving as a third gate electrode and a gate insulating film 123. A material for the gate electrode 112 is the same as the material for the gate electrode 102a and the gate electrode 102b.

The oxide semiconductor transistor 110 includes an oxide semiconductor film 114 serving as a second oxide semiconductor film which is formed over the gate electrode 112 with the gate insulating film 123 interposed therebetween. In the oxide semiconductor film 114, a channel formation region is formed. A material for the oxide semiconductor film 114 is the same as the material for the oxide semiconductor film 104.

The oxide semiconductor transistor 110 includes an electrode 115a which serves as one of the source electrode and the drain electrode and overlaps with part of the gate electrode 112 and part of the oxide semiconductor film 114, and an electrode 115b which serves as the other of the source electrode and the drain electrode and overlaps with part of the gate electrode 112 and part of the oxide semiconductor film 114. A material for the electrode 115a and the electrode 115b is the same as the material for the electrode 105a and the electrode 105b.

As in the oxide semiconductor transistor 100, in the oxide semiconductor transistor 110, the insulating film 126 is formed to cover the gate electrode 112, the gate insulating film 123, the oxide semiconductor film 114, the electrode 115a serving as one of a source electrode and a drain electrode, and the electrode 115b serving as the other of the source electrode and the drain electrode. The insulating film 126 is an insulating film that is formed in direct contact with the oxide semiconductor film 114, and serves as a protection film of the oxide semiconductor film 114.

The oxide semiconductor transistor 110 does not include an $L_{off}$ region and thus has a high on-state current. The oxide semiconductor transistor 110 with high on-state current can be used in a driver circuit of a display device. The display device in which the oxide semiconductor transistor 110 is used in a driver circuit will be described later.

Note that although in FIGS. 2A to 2C, the shapes of the gate electrode 102a, the gate electrode 102b, the oxide semiconductor film 104, the electrode 105a, and the electrode 105b of the oxide semiconductor transistor 100, and the shapes of the gate electrode 112, the oxide semiconductor film 114, the electrode 115a, and the electrode 115b of the oxide semiconductor transistor 110 are rectangular shapes, this embodiment is not limited thereto. The shapes of the gate electrode, the oxide semiconductor film, the source electrode, and the drain electrode which are components of the oxide semiconductor transistor 100 and the oxide semiconductor transistor 110 may be curved shapes as illustrated in FIGS. 10A to 10C. The oxide semiconductor transistor including the gate electrode, the oxide semiconductor film, the source electrode, and the drain electrode with curved shapes, in the case where an $L_{off}$ region is formed in the oxide semiconductor transistor, is preferable in terms of low on-state current. An oxide semiconductor transistor in which an $L_{off}$ region is not formed can be used for a driver circuit since it has a high on-state current.

Although bottom-gate transistors are described as the oxide semiconductor transistor 100 and the oxide semiconductor transistor 110 in this embodiment, this embodiment is not limited thereto. A top-gate oxide semiconductor transistor including an $L_{off}$ region is formed is preferable in terms of low on-state current. An oxide semiconductor transistor in which an $L_{off}$ region is not formed can be used for a driver circuit since it has a high on-state current.

A manufacturing method of the oxide semiconductor transistor 110 in which an $L_{off}$ region is not formed and the oxide semiconductor transistor 100 in which the $L_{off}$ region 109 is formed over the same substrate 101 is described below.

Figure 3A:
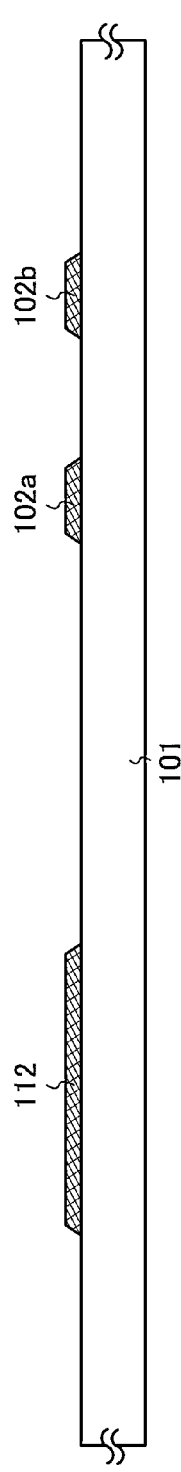
FIGS. 3A to 3C are cross-sectional views illustrating a manufacturing process of a semiconductor device.

First, over the substrate 101 having an insulating surface, the gate electrode 112, the gate electrode 102a, and the gate electrode 102b are formed (see FIG. 3A).

The gate electrode 112, the gate electrode 102a, and the gate electrode 102b are formed in such a manner that a conductive film is formed by a sputtering method or a vacuum evaporation method, and the conductive film is etched. Alternatively, the gate electrode 112, the gate electrode 102a, and the gate electrode 102b may be formed by discharging a conductive nanopaste by an ink jet method and baking the conductive nanopaste.

Figure 3B:
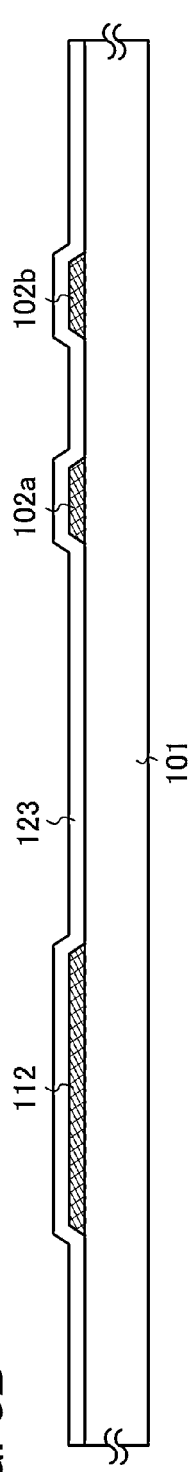

Next, the gate insulating film 123 is formed to cover the substrate 101, the gate electrode 112, the gate electrode 102a, and the gate electrode 102b (see FIG. 3B).

Figure 3C:
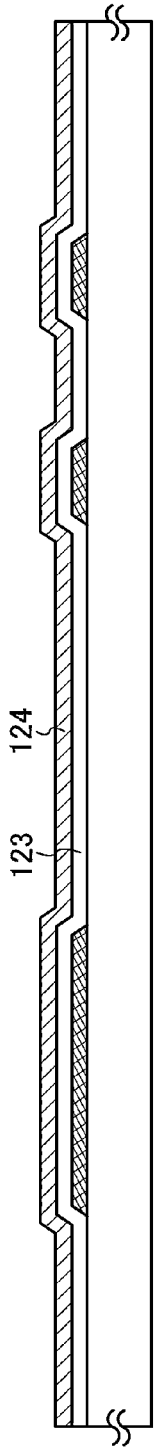

Then, an oxide semiconductor film 124 is formed to cover the gate insulating film 123 (see FIG. 3C). The oxide semiconductor film 124 may be formed by a sputtering method using the material for the oxide semiconductor film 104 as a target.

Then, the oxide semiconductor film 124 is processed by etching, so that the oxide semiconductor film 114 is formed over the gate electrode 112 with the gate insulating film 123 interposed therebetween, and the oxide semiconductor film 104 is formed over the gate electrode 102a and the gate electrode 102b with the gate insulating film 123 interposed therebetween (see FIG. 4A). Thus, the oxide semiconductor film 114 in which a channel formation region of the oxide semiconductor transistor 110 is formed and the oxide semiconductor film 104 in which a channel formation region of the oxide semiconductor transistor 100 is formed can be formed using the same material through the same steps.

In FIG. 4A, a region of the oxide semiconductor film 104 between the gate electrode 102a and the gate electrode 102b, that is, a region where the oxide semiconductor film 104 does not overlap with the gate electrodes is the $L_{off}$ region 109. The existence of the $L_{off}$ region 109 can reduce the on-state current of the oxide semiconductor transistor 100.

A conductive film 125 is formed to cover the gate insulating film 123, the oxide semiconductor film 114, and the oxide semiconductor film 104 (see FIG. 4B). The formation of the conductive film 125 may be performed by a sputtering method using the material of the electrode 105a and the electrode 105b as a target.

Next, the conductive film 125 is etched so that the electrode 115a and the electrode 115b which are a source electrode and a drain electrode of the oxide semiconductor transistor 110 and the electrode 105a and the electrode 105b which are a source electrode and a drain electrode of the oxide semiconductor transistor 100 are formed. As described above, the oxide semiconductor transistor 110 and the oxide semiconductor transistor 100 are manufactured (see FIG. 4C).

Then, an insulating film 126 functioning as a protection film is formed to cover the oxide semiconductor transistor 110 and the oxide semiconductor transistor 100 (see FIG. 2C).

Since the oxide semiconductor transistor 110 does not have an $L_{off}$ region, the on-state current is high. On the other hand, the oxide semiconductor transistor 100 has the $L_{off}$ region 109, whereby the on-state current is reduced.

Thus, the oxide semiconductor transistor 100 whose on-state current is low and the oxide semiconductor transistor 110 whose on-state current is high can be manufactured over the same substrate 101.

Note that in this embodiment, etching is performed on the oxide semiconductor film 124 so that the oxide semiconductor film 114 and the oxide semiconductor film 104 are formed, and then the conductive film 125 is formed and etched so that the electrode 115a, the electrode 115b, the electrode 105a, and the electrode 105b are formed. However, this embodiment is not limited to the above manufacturing process. The oxide semiconductor film 124 and the conductive film 125 may be formed and then etched using the same mask. The etching of the oxide semiconductor film 124 and the conductive film 125 using the same mask can reduce the number of masks and the number of manufacturing steps.

By manufacturing an oxide semiconductor transistor 100 whose on-state current is low and an oxide semiconductor transistor 110 whose on-state current is high over the same substrate 101 in the above manner, the number of manufacturing steps of oxide semiconductor transistors can be reduced and thus the manufacturing cost can be lower.

Note that although in this embodiment, as the oxide semiconductor transistor 100 whose on-state current is low and the oxide semiconductor transistor 110 whose on-state current is high, an example in which bottom-gate transistors are manufactured is described, one embodiment of the disclosed invention is not limited thereto. Also in the case where top-gate transistors are employed as the oxide semiconductor transistor 100 and the oxide semiconductor transistor 110, the transistors can be manufactured simultaneously over one substrate. Therefore, the number of manufacturing steps of the oxide semiconductor transistors can be reduced, leading to reduction in the manufacturing cost.

<Display Device>

In this embodiment, an example of a light-emitting display device is described as a display device according to one embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 5A:
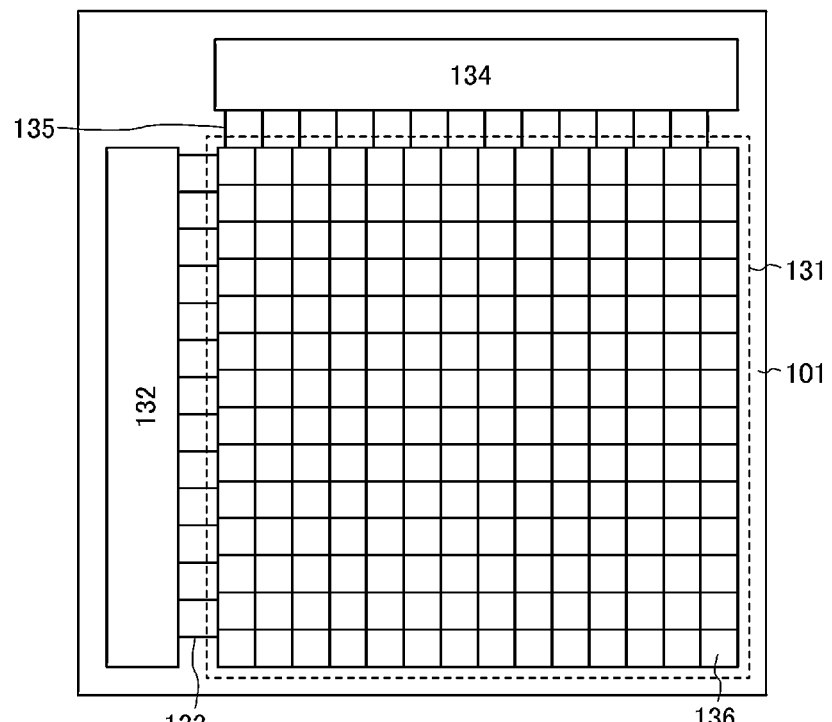
FIG. 5A is a block diagram of a display device and FIG. 5B is a circuit diagram of a pixel.

In FIG. 5A, as an example of a light-emitting display device according to one embodiment of the present invention, an active matrix EL display device is illustrated. The light-emitting display device illustrated in FIG. 5A includes, over the substrate 101 having an insulating surface, a pixel portion 131 including a plurality of pixels 136, and a gate driver 132 and a source driver 134 which are driver circuits for driving the pixel portion 131.

The pixel portion 131 is connected to the source driver 134 via a plurality of source lines 135 that extends from the source driver 134. The pixel portion 131 is also connected to the gate driver 132 via a plurality of gate lines 133 that extends from the gate driver 132. The pixel portion 131 includes the plurality of pixels 136 arranged in matrix corresponding to the source lines 135 and the gate lines 133.

Figure 5B:
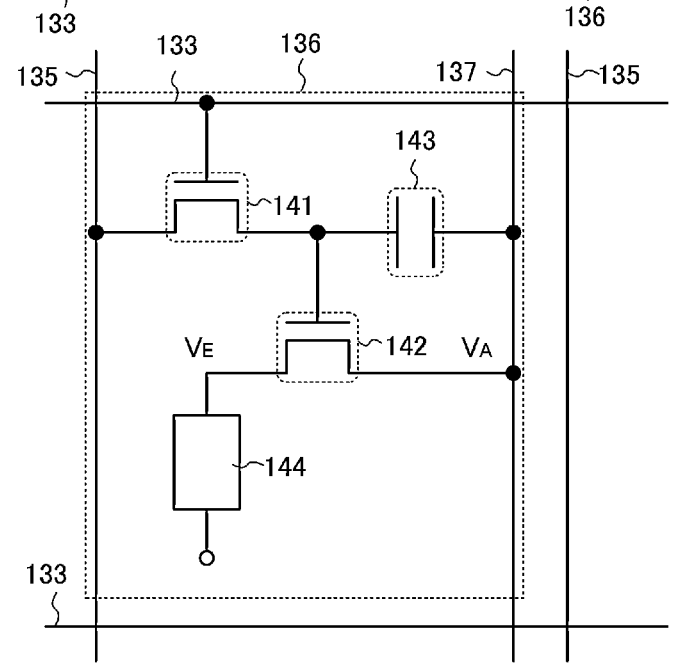

Each pixel 136 includes a transistor 141, a transistor 142, a light-emitting element 144, a capacitor 143, the source line 135, the gate line 133, and a power supply line 137 (see FIG. 5B).

One of a source and a drain of the transistor 141 is electrically connected to the source line 135. The other of the source and the drain of the transistor 141 is electrically connected to one terminal of the capacitor 143 and a gate of the transistor 142. A gate of the transistor 141 is electrically connected to the gate line 133. The transistor 141 functions as a switching element that controls on/off of the transistor 142.

One of a source and a drain of the transistor 142 is electrically connected to the light-emitting element 144. The other of the source and the drain of the transistor 142 is electrically connected to the other terminal of the capacitor 143 and the power supply line 137. The gate of the transistor 142 is electrically connected to the other of the source and the drain of the transistor 141 and one terminal of the capacitor 143. The transistor 142 functions as a current control element for controlling a current flowing in the light-emitting element 144.

One terminal of the capacitor 143 is electrically connected to the other of the source and the drain of the transistor 141 and the gate of the transistor 142. The other terminal of the capacitor 143 is electrically connected to the other of the source and the drain of the transistor 142 and the power supply line 137.

The light-emitting element 144 is electrically connected to one of the source and the drain of the transistor 142.

For the transistor 141 and the transistor 142 used in the pixel 136, the oxide semiconductor transistor 100 described with reference to FIGS. 1A and 1B and FIGS. 2B and 2C can be employed.

When the oxide semiconductor transistor 100 having the $L_{off}$ region 109 is used as the transistor 141 and the transistor 142 used in the pixel 136, the transistor 141 and the transistor 142 with reduced on-state current can be obtained without increasing the occupied area.

The oxide semiconductor transistor whose on-state current is reduced is used in the pixel 136 of a light-emitting display device as described above, whereby decrease in aperture ratio of the light-emitting display device can be suppressed.

Further, it is particularly preferable to use the transistor whose on-state current is reduced as the transistor 142 that is a current control transistor of the light-emitting element 144 because even when the driving voltage of the transistor 142 changes, the amount of change in drain current is small. The reason is explained below.

The luminance of the light-emitting display device of this embodiment depends on current of the light-emitting element 144 and the transistor 142. Therefore, characteristics of the light-emitting element 144 and the transistor 142 are important for the luminance of the light-emitting display device.

A difference in characteristics between the following two cases is described with reference to FIGS. 9A and 9B: the case of using a transistor in which the channel length is long and thus the on-state current is low as the transistor 142 illustrated in FIGS. 5A and 5B and the case of using a transistor in which the channel length is short and thus the on-state current is high as the transistor 142 illustrated in FIGS. 5A and 5B.

In FIGS. 5A and 5B, the voltage of one of the source and the drain of the transistor 142, which is connected to the power supply line 137, is referred to as a voltage $V_A$, and the voltage of the other of the source and the drain of the transistor 142, which is connected to the light-emitting element 144, is referred to as a voltage $V_E$.

Figure 9A:
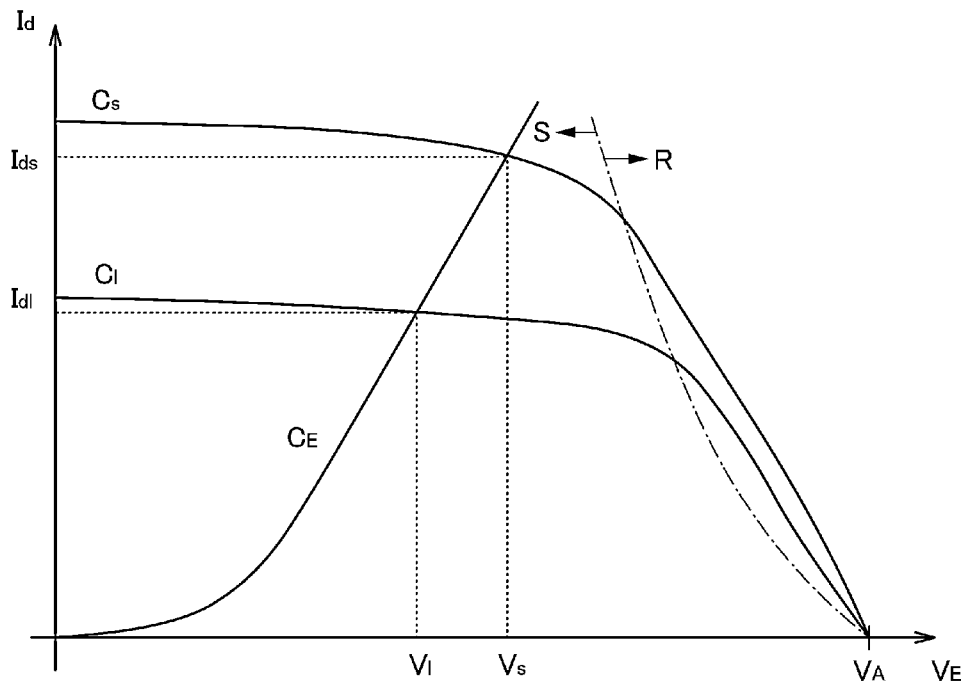
FIGS. 9A and 9B are graphs showing characteristics of transistors whose channel lengths are different from each other.
Figure 9B:
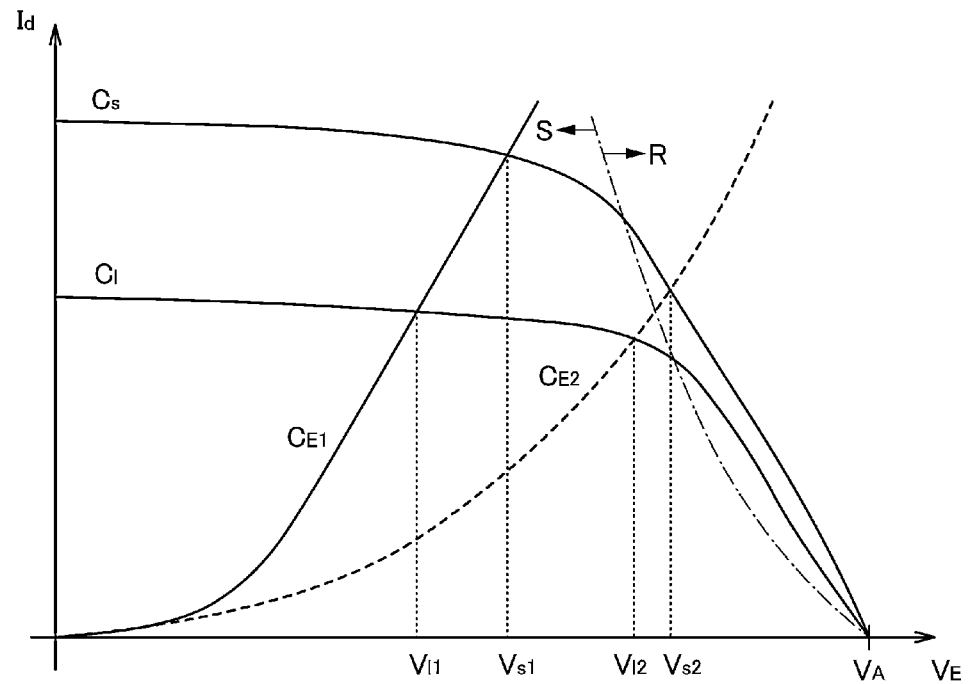

FIGS. 9A and 9B show voltage $V_E$ vs. drain current $I_d$ characteristics (hereinafter also referred to as "$V_E$-$I_D$ characteristics") of the transistor having a low on-state current (having a long channel length) and the transistor having a high on-state current (having a short channel length) and voltage characteristics of the light-emitting element 144. Note that at this time, the voltage $V_{gs}$ between a gate and a source of the transistor having a low on-state current (having a long channel length) is equal to that of the transistor having a high on-state current (having a short channel length).

In FIG. 9A, a curve showing the voltage characteristics of the light-emitting element 144 is referred to as a curve $C_E$.

In addition, a curve showing the $V_E$-$I_D$ characteristics of the transistor having a low on-state current (having a long channel length) is referred to as a curve $C_l$, a voltage of the point where the curve $C_l$ intersects with the curve $C_E$ is referred to as a voltage $V_l$, and a current of the point where the curve $C_l$ intersects with the curve $C_E$ is referred to as current $I_{dl}$.

In addition, a curve showing the $V_E$-$I_D$ characteristics of the transistor having a high on-state current (having a short channel length) is referred to as a curve $C_s$, a voltage of the point where the curve $C_s$ intersects with the curve $C_E$ is referred to as a voltage $V_s$, and a current of the point where the curve $C_s$ intersects with the curve $C_E$ is referred to as current $I_{ds}$.

Each of the curve $C_l$ and the curve $C_s$ has a saturation region S and a linear region R. The saturation region S is a region where the drain current $I_d$ hardly changes with respect to the voltage $V_E$. The linear region R is a region where the drain current $I_d$ changes linearly with respect to the voltage $V_E$.

The voltage $V_l$ is a driving voltage of the transistor having a low on-state current (having a long channel length), and the voltage $V_s$ is a driving voltage of the transistor having a high on-state current (having a short channel length).

In FIG. 9B, the voltage characteristics in the case where the light-emitting element 144 deteriorates and a current flowing in the light-emitting element 144 becomes low are shown.

In FIG. 9B, a curve $C_{E1}$ shows the voltage characteristics of the light-emitting element 144 that has not started to deteriorate yet, and a curve $C_{E2}$ shows the voltage characteristics of the light-emitting element 144 that has deteriorated.

A voltage of the point where the curve $C_l$ showing the $V_E$-$I_D$ characteristics of the transistor having a low on-state current (having a long channel length) intersects with the curve $C_{E1}$ is referred to as a driving voltage $V_{l1}$. A voltage of the point where the curve $C_s$ showing the $V_E$-$I_D$ characteristics of the transistor having a high on-state current (having a short channel length) intersects with the curve $C_{E1}$ is referred to as a driving voltage $V_{s1}$.

Similarly, a voltage of the point where the curve $C_l$ showing the $V_E$-$I_D$ characteristics of the transistor having a low on-state current (having a long channel length) intersects with the curve $C_{E2}$ is referred to as a driving voltage $V_{l2}$. A voltage of the point where the curve $C_s$ showing the $V_E$-$I_D$ characteristics of the transistor having a high on-state current (having a short channel length) intersects with the curve $C_{E2}$ is referred to as a driving voltage $V_{s2}$.

When the light-emitting element 144 deteriorates and the current flowing in the light-emitting element 144 becomes low, the value of voltage applied to the light-emitting element 144 needs to be increased. Therefore, the values of the driving voltage $V_{l2}$ and the driving voltage $V_{s2}$ are higher than those of the driving voltage $V_{l1}$ and the driving voltage $V_{s1}$. Further, when the values of the driving voltage $V_{l2}$ and the driving voltage $V_{s2}$ become high, the driving voltage $V_{l2}$ and the driving voltage $V_{s2}$ might enter the linear region R.

FIG. 9B shows the case where the driving voltage $V_{s2}$ of the transistor having a high on-state current (having a short channel length) is in the linear region R. When the driving voltage is in the linear region R, the drain current might be significantly changed due to a slight change in driving voltage.

On the other hand, the driving voltage $V_{l2}$ of the transistor having a low on-state current (having a long channel length) is not in the linear region R and is in the saturation region S.

Therefore, the transistor having a low on-state current (having a long channel length) has an effect of suppressing the change in drain current even when the driving voltage changes.

Accordingly, the transistor having a low on-state current (having a long channel length) is particularly suitable for the transistor 142 in that the amount of change in drain current is small even when the driving voltage of the transistor 142 changes.

As a transistor used in the gate driver 132 and the source driver 134 for driving the pixel portion 131 including the plurality of pixels 136, the oxide semiconductor transistor 110 illustrated in FIGS. 2A and 2C can be used.

With use of the oxide semiconductor transistor 110 as a transistor used in the gate driver 132 and the source driver 134, the oxide semiconductor transistor 110 whose on-state current is high and the oxide semiconductor transistor 100 whose on-state current is low can be manufactured over the same substrate 101.

The formation of the oxide semiconductor transistor 110 whose on-state current is high and the oxide semiconductor transistor 100 whose on-state current is low over the same substrate 101 can reduce the manufacturing steps of the oxide semiconductor transistor 110 and the oxide semiconductor transistor 100, leading to reduction in the manufacturing cost.

According to this embodiment, a display device in which, over the same substrate 101, the oxide semiconductor transistor 100 whose on-state current is low is used in the pixel 136 and the oxide semiconductor transistor 110 whose on-state current is high is used in the driver circuits (the gate driver 132 and the source driver 134) can be obtained.

As a transistor used in the pixel portion 131 including the plurality of pixels 136 and a transistor used in the driver circuits (the gate driver 132 and the source driver 134), the oxide semiconductor transistor 100 and the oxide semiconductor transistor 110 can be manufactured over the same substrate 101. Therefore, the manufacturing steps of the light-emitting display device can be reduced and thus the manufacturing cost can be reduced.

Figure 6A:
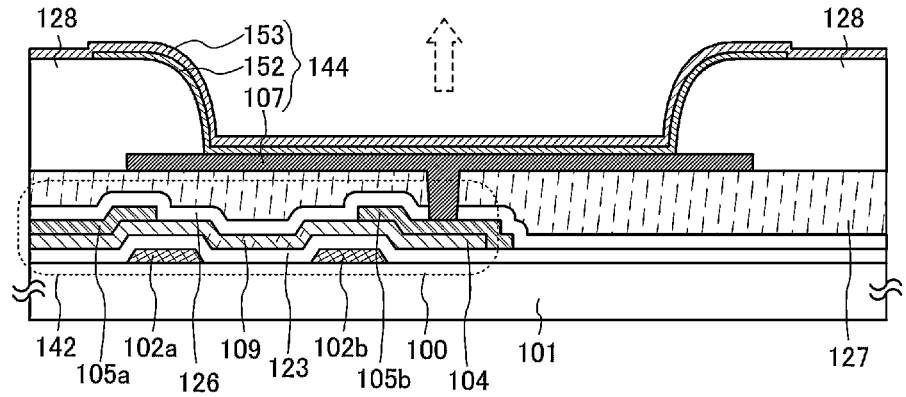
FIGS. 6A to 6C are cross-sectional views of display devices.
Figure 6B:
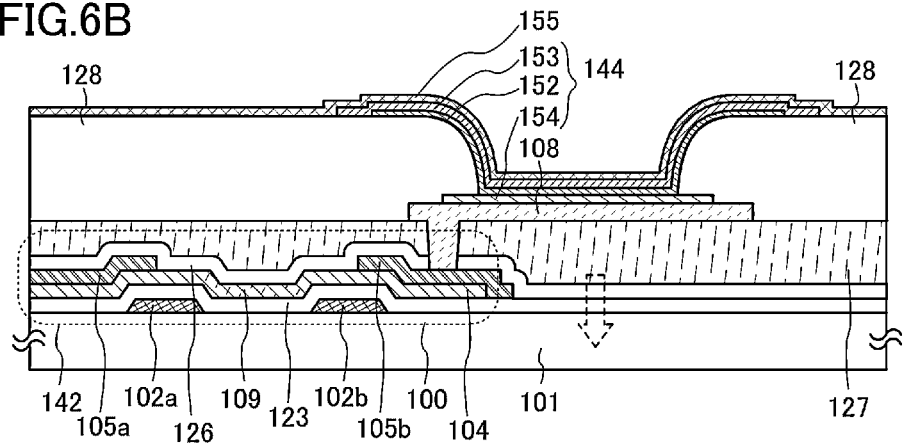
Figure 6C:
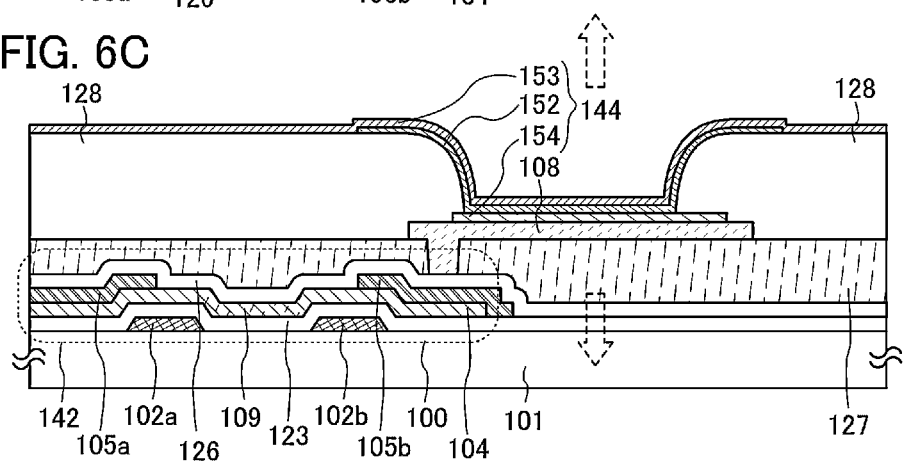

FIGS. 6A to 6C illustrate cross sections of the light-emitting element 144 and the oxide semiconductor transistor 100 used as the transistor 142.

A light-emitting display device illustrated in FIG. 6A includes the substrate 101, the oxide semiconductor transistor 100 as the transistor 142, the insulating film 126, an insulating film 127, a partition wall 128, an electrode 107, a light-emitting layer 152, and an electrode 153. The electrode 107 is electrically connected to the other of the source electrode and the drain electrode of the oxide semiconductor transistor 100. The light-emitting element 144 includes the electrode 107, the light-emitting layer 152, and the electrode 153.

In order to extract light emitted from the light-emitting element 144, at least one of an anode and a cathode of the light-emitting element 144 has a light-transmitting property. A transistor and a light-emitting element are formed over a substrate. A light-emitting element can have a top emission structure, in which light emission is extracted through the surface on the side opposite to the substrate side; a bottom emission structure, in which light emission is extracted through the surface on the substrate side; or a dual emission structure, in which light emission is extracted through the surface on the side opposite to the substrate side and the surface on the substrate side. The pixel structure according to one embodiment of the present invention can be applied to a light-emitting element having any of these emission structures.

FIG. 6A illustrates the light-emitting element 144 with a top-emission structure.

The insulating film 127 is preferably formed using an organic resin such as acrylic, polyimide, or polyamide or using siloxane.

In this embodiment, the transistor 142 (the oxide semiconductor transistor 100) in the pixel 136 is an n-channel transistor. Thus, the electrode 107 is preferably used as a cathode. Specifically, for the cathode, a metal material with a low work function, such as Ca, Al, CaF, MgAg, or AlLi can be used.

The partition wall 128 is formed using an organic resin film, an inorganic insulating film, or organic polysiloxane. It is particularly preferable that the partition wall 128 be formed using a photosensitive material to have an opening over the electrode 107 so that a sidewall of the opening is formed as a tilted surface with continuous curvature.

The light-emitting layer 152 may be formed to have a single-layer structure or a stacked structure including a plurality of layers.

The electrode 153 is formed as an anode to cover the light-emitting layer 152. The electrode 153 can be formed from a light-transmitting conductive film that is formed using a conductive material having a light-transmitting property.

As the conductive material having a light-transmitting property, indium oxide containing tungsten oxide, indium zinc oxide containing tungsten oxide, indium oxide containing titanium oxide, indium tin oxide containing titanium oxide, indium tin oxide, indium zinc oxide, and indium tin oxide to which silicon oxide is added are given, for example.

The light-emitting element 144 is formed from an overlap of the electrode 107, the light-emitting layer 152, and the electrode 153. In order to prevent entry of oxygen, hydrogen, moisture, carbon dioxide, and the like into the light-emitting element 144, a protection film may be formed to cover the electrode 153 and the partition wall 128. As the protection film, a silicon nitride film, a silicon nitride oxide film, a DLC film, or the like can be formed.

In the case of the light-emitting element 144 illustrated in FIG. 6A, the electrode 107 serving as a cathode is formed using a metal material having a light-blocking property, and the electrode 153 serving as an anode is formed using a conductive material having a light-transmitting property. Therefore, light is emitted from the light-emitting element 144 illustrated in FIG. 6A toward the electrode 153 side as indicated by an arrow. The light-emitting element 144 illustrated in FIG. 6A is a light-emitting element with a top-emission structure.

Since the light-emitting element illustrated in FIG. 6A is a light-emitting element with a top-emission structure, it is difficult to increase the aperture ratio of the light-emitting display device. However, the on-state current of the transistor 142 is optimized according to this embodiment, and the light-emitting display device according to this embodiment can be used favorably.

FIG. 6B illustrates the light-emitting element 144 with a bottom-emission structure.

In FIG. 6B, the electrode 108 electrically connected to the transistor 142 (the oxide semiconductor transistor 100) in the pixel 136 is formed using the above-described conductive material having a light-transmitting property.

The electrode 154 serving as the cathode of the light-emitting element 144 is formed over the electrode 108 having a light-transmitting property, and the light-emitting layer 152 and the electrode 153 serving as the anode are stacked in this order over the electrode 154.

For the electrode 154 serving as a cathode, a variety of materials can be employed as long as it is a conductive material with a low work function, as in the electrode 107 illustrated in FIG. 6A. Note that the electrode 154 is formed to have a thickness that can transmit light (preferably about 5 nm to 30 nm). For example, an aluminum film having a thickness of 20 nm can be used as the electrode 154.

In the case where the electrode 153 has a light-transmitting property, a light-blocking film 155 for reflecting or blocking light is formed to cover the electrode 153. As the light-blocking film 155, metal or the like that reflects light can be used for example; however, the light-blocking film 155 is not limited to a metal film. For example, a resin to which a black pigment is added can be used.

The light-emitting element 144 is formed from an overlap of the electrode 154, the light-emitting layer 152, and the electrode 153. In order to prevent entry of oxygen, hydrogen, moisture, carbon dioxide, and the like into the light-emitting element 144, a protection film may be formed to cover the light-blocking film 155 and the partition wall 128. As the protection film, a silicon nitride film, a silicon nitride oxide film, a DLC film, or the like can be formed.

In the case of the light-emitting element 144 illustrated in FIG. 6B, the thickness of the electrode 154 serving as the cathode is small enough to transmit light. Further, the electrode 108 having a light-transmitting property is formed below the electrode 154. Furthermore, the light-blocking film 155 is formed to cover the electrode 153 serving as an anode.

Therefore, light is emitted from the light-emitting element 144 illustrated in FIG. 6B toward the electrode 154 side as indicated by an arrow. The light-emitting element 144 illustrated in FIG. 6B is a light-emitting element with a bottom-emission structure.

Although the light-emitting element illustrated in FIG. 6B is a light-emitting element with a top-emission structure, the aperture ratio of the light-emitting display device can be increased according to this embodiment. Further, the on-state current of the transistor 142 is optimized according to this embodiment, and the light-emitting display device according to this embodiment can be used favorably.

FIG. 6C illustrates the light-emitting element 144 with a dual-emission structure.

In FIG. 6C, as in FIG. 6B, the electrode 108 electrically connected to the transistor 142 (the oxide semiconductor transistor 100) in the pixel 136 is formed using the above-described conductive material having a light-transmitting property.

In the light-emitting element 144 illustrated in FIG. 6C, as in FIG. 6B, the electrode 154 serving as the cathode of the light-emitting element 144 is formed over the electrode 108 having a light-transmitting property, and the light-emitting layer 152 and the electrode 153 serving as the anode are stacked in this order over the electrode 154.

For the electrode 154 serving as a cathode, a variety of materials can be employed as long as it is a conductive material with a low work function, as in the electrode 107 illustrated in FIG. 6A. Note that the electrode 154 is formed to have a thickness that can transmit light (preferably about 5 nm to 30 nm). For example, an aluminum film having a thickness of 20 nm can be used as the electrode 154.

The light-emitting element 144 is formed from an overlap of the electrode 154, the light-emitting layer 152, and the electrode 153. In order to prevent entry of oxygen, hydrogen, moisture, carbon dioxide, and the like into the light-emitting element 144, a protection film may be formed to cover the electrode 153 and the partition wall 128. As the protection film, a silicon nitride film, a silicon nitride oxide film, a DLC film, or the like can be formed.

In the case of the light-emitting element 144 illustrated in FIG. 6C, the thickness of the electrode 154 serving as the cathode is small enough to transmit light. Further, the electrode 108 having a light-transmitting property is formed below the electrode 154. Furthermore, the electrode 153 serving as an anode is also formed using a conductive material having a light-transmitting property.

Therefore, light is emitted from the light-emitting element 144 illustrated in FIG. 6C toward both the electrode 154 side and the electrode 153 side as indicated by an arrow. The light-emitting element 144 illustrated in FIG. 6C is a light-emitting element with a bottom-emission structure.

Furthermore, it is preferable that the thus formed light-emitting element 144 be packaged (sealed) with a protective film (such as a bonding film or an ultraviolet curable resin film) or a cover material with high air-tightness and little degasification so that the light-emitting element 144 is not exposed to the outside air.

Note that, although an organic EL element is described here as the light-emitting element 144, an inorganic EL element can also be provided as the light-emitting element 144.

Further, if necessary, the oxide semiconductor transistor 100 may be provided with a light-blocking film for shielding the $L_{off}$ region 109 or a light-blocking film for shielding the whole oxide semiconductor transistor 100. Such a light-blocking film can improve the light extraction efficiency.

<Display Panel>

Figures 7A, 7B:
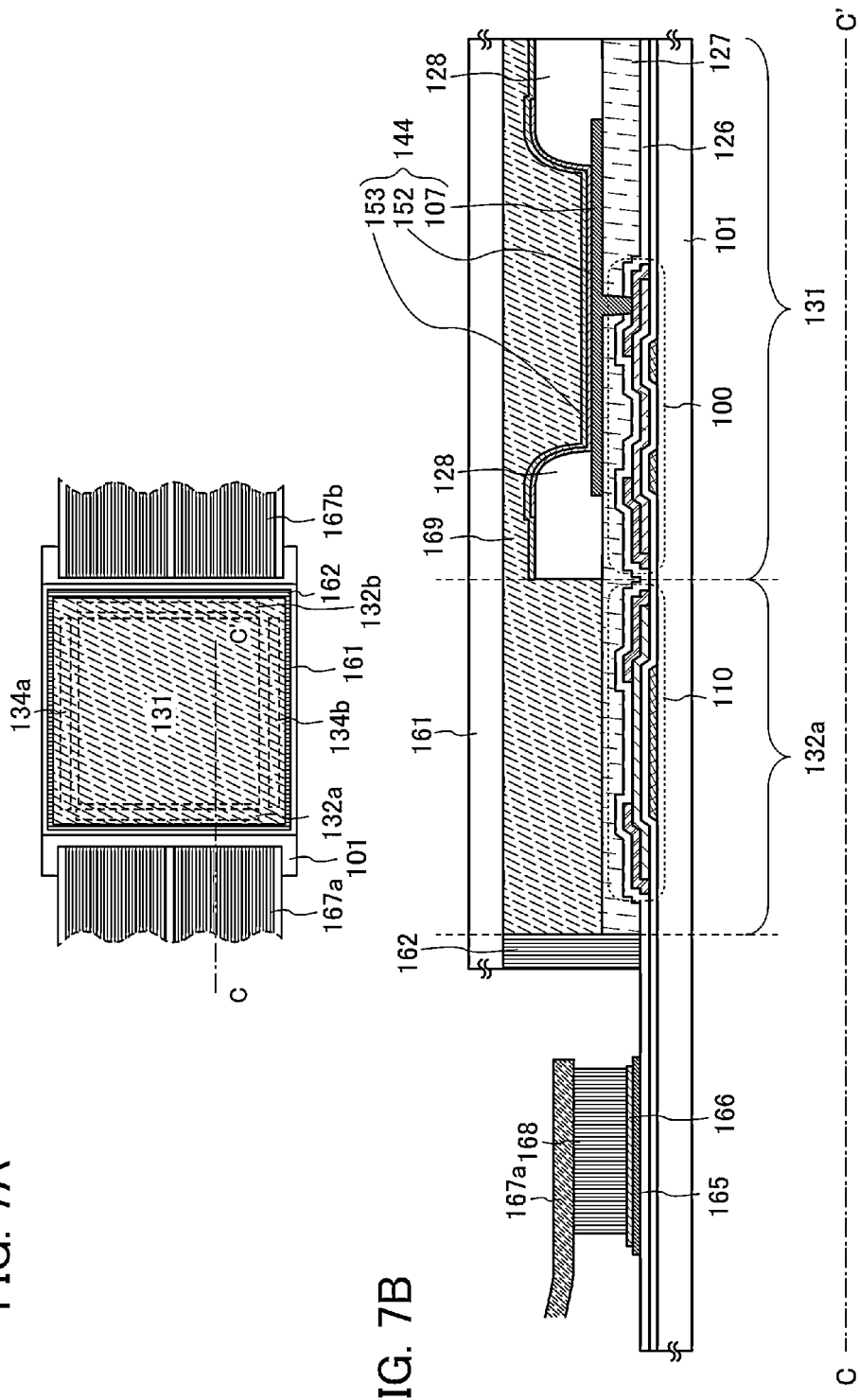
FIG. 7A is a top view of a display panel and 7B is a cross-sectional view thereof.

FIGS. 7A and 7B are a top view and a cross-sectional view illustrating a display panel which is one mode of the display device of this embodiment. FIG. 7B corresponds to a cross-sectional view taken along C-C' in FIG. 7A.

A sealing material 162 is provided to surround the pixel portion 131, a gate driver 132a, a gate driver 132b, a source driver 134a, and a source driver 134b which are formed over the first substrate 101. Further, a second substrate 161 is provided over the pixel portion 131, the gate driver 132a, the gate driver 132b, the source driver 134a, and the source driver 134b. The pixel portion 131, the gate driver 132a, the gate driver 132b, the source driver 134a, and the source driver 134b are sealed together with a filler 169, by the first substrate 101, the second substrate 161, and the sealing material 162.

As a transistor used in the pixel portion 131 over the first substrate 101, the oxide semiconductor transistor 100 described with reference to FIGS. 1A and 1B and FIGS. 2B and 2C can be used, in the above manner.

With use of the oxide semiconductor transistor 100 having the $L_{off}$ region 109 as the transistor used in the pixel portion 131, the on-state current of the transistor used in the pixel portion 131 can be reduced without increasing the occupied area.

In a display panel in which the oxide semiconductor transistor 100 is used in the pixel portion 131, reduction in aperture ratio of the display panel can be suppressed.

As a transistor used in the gate driver 132a, the gate driver 132b, the source driver 134a, and the source driver 134b, the oxide semiconductor transistor 110 described with reference to FIGS. 2A and 2C can be used, in the above manner.

Accordingly, a display panel in which, over the same substrate 101, the oxide semiconductor transistor 100 whose on-state current is low is used in the pixel portion 131 and the oxide semiconductor transistor 110 whose on-state current is high is used in the gate driver 132a, the gate driver 132b, the source driver 134a, and the source driver 134b, can be obtained. Therefore, the manufacturing steps of the display panel can be reduced and thus the manufacturing cost can be reduced.

Signals and potentials are supplied to the gate driver 132a, the gate driver 132b, the source driver 134a, and the source driver 134b through an FPC 167a and an FPC 167b.

For the light-emitting element 144 of the display panel illustrated in FIG. 7B, the light-emitting element with a top-emission structure illustrated in FIG. 6A is employed. In the display panel, a connection terminal 165 is formed from the same conductive film as the electrode 107, and a wiring 166 is formed from the same conductive film as the electrode 153 included in the light-emitting element 144.

Note that without limitation to the light-emitting element with a top-emission structure illustrated in FIG. 6A, the light-emitting element with a bottom-emission structure illustrated in FIG. 6B or the light-emitting element with a dual-emission structure illustrated in FIG. 6C may be used as the light-emitting element 144.

In the case where the light-emitting element with a bottom-emission structure illustrated in FIG. 6B is used in the display panel illustrated in FIG. 7B, the same conductive film as the electrode 108 or the electrode 154 can be used for the connection terminal 165, and the same conductive film as the electrode 153 can be used for the wiring 166.

In the case where the light-emitting element with a dual-emission structure illustrated in FIG. 6C is used in the display panel illustrated in FIG. 7B, the same conductive film as the electrode 108 or the electrode 154 can be used for the connection terminal 165, and the same conductive film as the electrode 153 can be used for the wiring 166.

The connection terminal 165 is electrically connected to a terminal included in the FPC 167a through an anisotropic conductive film 168.

In the case where the light-emitting element with a top-emission structure illustrated in FIG. 6A or the light-emitting element with a dual-emission structure illustrated in FIG. 6C is used as the light-emitting element 144, the second substrate 161 located in the direction in which light is extracted from the light-emitting element 144 needs to have a light-transmitting property. In that case, a light-transmitting material such as a glass plate, a plastic plate, a polyester film, or an acrylic film is used for the second substrate 161.

As the filler 169, an ultraviolet curable resin or a thermosetting resin can be used in addition to an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. In this embodiment, nitrogen is used for the filler 169.

As needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element 144. Further, the polarizing plate or the circularly polarizing plate may be provided with an anti-reflection film. For example, anti-glare treatment can be performed by which reflected light is diffused by projections on the surface so as to reduce the glare.

According to this embodiment, the oxide semiconductor transistor in which the on-state current is reduced and increase in occupied area is suppressed can be obtained as described above.

Further, according to this embodiment, the oxide semiconductor transistor whose on-state current is reduced is used in a pixel of a display device, whereby decrease in aperture ratio of the display device can be suppressed.

According to this embodiment, an oxide semiconductor transistor whose on-state current is low and an oxide semiconductor transistor whose on-state current is high over one substrate can be manufactured.

Further, according to this embodiment, a display device in which, over the same substrate, the oxide semiconductor transistor whose on-state current is low is used in the pixel and the oxide semiconductor transistor whose on-state current is high is used in the driver circuits can be obtained.

EXAMPLE 1

In this example, change in characteristics of the oxide semiconductor transistor in the case where the length F of the $L_{off}$ region 109 in the channel length direction is changed is described. More specifically, dependence of the gate-source voltage $V_{gs}$ vs. the drain current $I_d$ characteristics (hereinafter also referred to as "$V_{gs}$-$I_d$ characteristics") on the length F is described.

Figure 8:
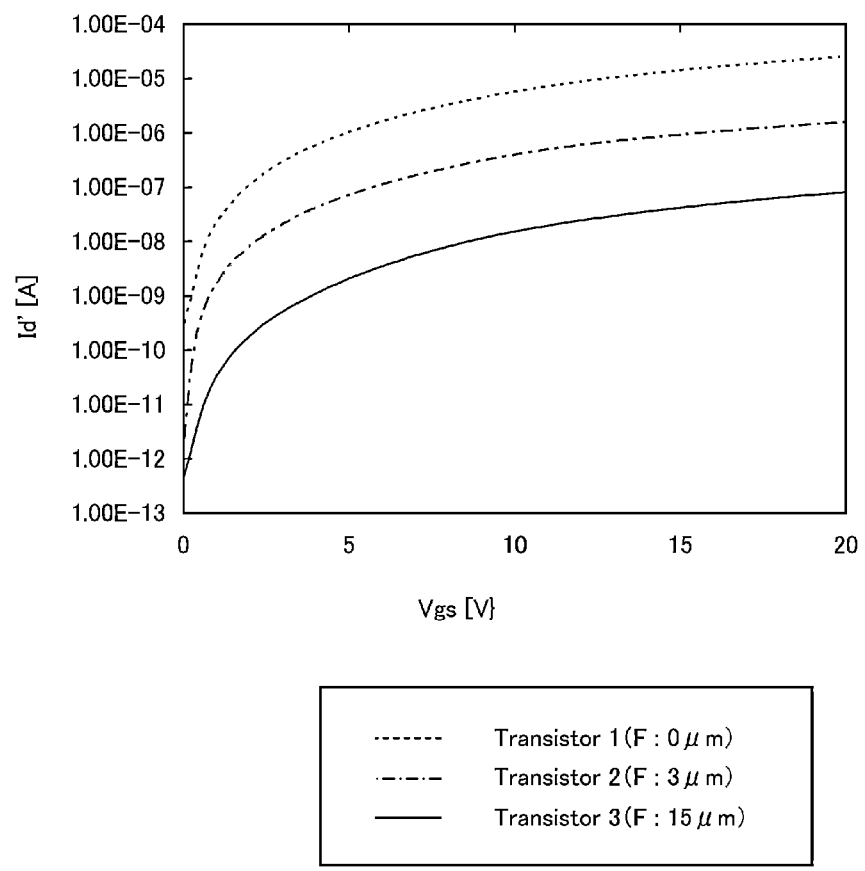
FIG. 8 is a graph showing $V_{gs}$-$I_d$ characteristics of an oxide semiconductor transistor.

FIG. 8 shows the $V_{gs}$-$I_d$ characteristics of the oxide semiconductor transistor in the case where the length F is changed. As the oxide semiconductor transistor of this example, the oxide semiconductor transistor 100 described in the above embodiment was used. Further, an oxide semiconductor transistor in which the length F is 0 µm, that is, an $L_{off}$ region does not exist has the same structure as the oxide semiconductor transistor 110 in the above embodiment. Note that in this example, an oxide formed of indium oxide, gallium oxide, and zinc oxide (indium gallium zinc oxide: IGZO) was used as a material for the oxide semiconductor film 104 in the oxide semiconductor transistor 100 and the oxide semiconductor film 114 in the oxide semiconductor transistor 110.

The oxide semiconductor transistors measured in this example have different channel lengths L and different channel widths W from each other. The drain current $I_d$ varies depending on the channel length L and the channel width W. Therefore, in this example, the drain current $I_d$ was normalized on the basis of the ratio of the channel length L to the channel width W.

An oxide semiconductor transistor in which an $L_{off}$ region does not exist is referred to as a transistor 1, the channel length L of the transistor 1 is referred to as a channel length $L_1$, and the channel width W of the transistor 1 is referred to as $W_1$.

An oxide semiconductor transistor in which the length F of the $L_{off}$ region 109 in the channel length direction is 3 µm is referred to as a transistor 2. The channel length L of the transistor 2 is referred to as a channel length $L_2$, the channel width W of the transistor 2 is referred to as $W_2$, and the measured drain current $I_d$ of the transistor 2 is referred to as $I_{d2}$. Similarly, an oxide semiconductor transistor in which the length F in the channel length direction is 10 µm is referred to as a transistor 3, the channel length L, the channel width W, and the measured drain current $I_d$ of the transistor 3 are referred to as a channel length $L_3$, a channel width $W_3$, and a drain current $I_{d3}$, respectively (see Table 1).

TABLE 1

| name | channel length L | length (μm) | channel width W | length (μm) | F length (μm) | drain current $I_d$ measured $I_d$ | normalized $I_d$ |
|---|---|---|---|---|---|---|---|
| transistor 1 | $L_1$ | 20 | $W_1$ | 10 | 0 | | |
| transistor 2 | $L_2$ | 9 | $W_2$ | 11 | 3 | $I_{d2}$ | $I_{d2}'$ |
| transistor 3 | $L_3$ | 21 | $W_3$ | 11 | 15 | $I_{d3}$ | $I_{d3}'$ |

The drain current $I_{d2}$ of the transistor 2 and the drain current $I_{d3}$ of the transistor 3 were normalized on the basis of the ratio $L_1/W_1$, which is the ratio of the channel width $W_1$ of the transistor 1 to the channel length $L_1$ of the transistor 1.

As for the transistor 2, the measured drain current $I_d$ is referred to as the drain current $I_{d2}$, and the normalized drain current is referred to as a drain current $I_{d2}'$. When the measured drain current $I_{d2}$ is normalized on the basis of $L_1/W_1$, the formula $I_{d2}':I_{d2}=W_2/L_2:W_1/L_1$ is satisfied. Accordingly, the formula $I_{d2}'=I_{d2}\times(W_2/L_2)\times(L_1/W_1)$ is satisfied. As for the transistor 3, a similar normalization was performed (see Table 1).

FIG. 8 shows the $V_{gs}$-$I_d$ characteristics of the transistor 1, the normalized $V_{gs}$-$I_d$ characteristics of the transistor 2, and the normalized $V_{gs}$-$I_d$ characteristics of the transistor 3. In FIG. 8, a dotted line indicates the $V_{gs}$-$I_d$ characteristics of the transistor 1, alternate long and short dashed lines indicate the $V_{gs}$-$I_d$ characteristics of the transistor 2, and a solid line indicates the $V_{gs}$-$I_d$ characteristics of the transistor 3.

As shown in FIG. 8, as the length F of the $L_{off}$ region 109 in the channel length direction was longer, the normalized drain current $I_d'$ was lower.

Thus, according to this example, the effect of reducing on-state current by the existence of the $L_{off}$ region 109 was able to be confirmed.

Thus, according to one embodiment of the disclosed invention, an oxide semiconductor transistor in which the on-state current can be reduced without increasing the occupied area can be provided.

Further, according to one embodiment of the disclosed invention, an oxide semiconductor transistor whose on-state current is reduced is used in a pixel without decreasing the aperture ratio can be provided.

Furthermore, according to one embodiment of the disclosed invention, an oxide semiconductor transistor whose on-state current is low and an oxide semiconductor transistor whose on-state current is high over one substrate can be manufactured.

By manufacturing an oxide semiconductor transistor whose on-state current is low and an oxide semiconductor transistor whose on-state current is high over one substrate, the number of manufacturing steps of oxide semiconductor transistors can be reduced and thus the manufacturing cost can be lower.

According to one embodiment of the disclosed invention, a display device in which over one substrate, an oxide semiconductor transistor whose on-state current is low is used in a pixel and an oxide semiconductor transistor whose on-state current is high is used in a driver circuit can be provided.

An oxide semiconductor transistor whose on-state current is low is manufactured in a pixel and an oxide semiconductor transistor whose on-state current is high is manufactured in a driver circuit, the number of manufacturing steps of a display device can be reduced and thus the manufacturing cost can be lower.

Explanation of Reference

100: oxide semiconductor transistor, 101: substrate, 102a: gate electrode, 102b: gate electrode, 104: oxide semiconductor film, 105a: electrode, 105b: electrode, 107: electrode, 108: electrode, 109: $L_{off}$ region, 110: oxide semiconductor transistor, 112: gate electrode, 114: oxide semiconductor film, 115a: electrode, 115b: electrode, 123: gate insulating film, 124: oxide semiconductor film, 125: conductive film, 126: insulating film, 127: insulating film, 128: partition wall, 131: pixel portion, 132: gate driver, 132a: gate driver, 132b: gate driver, 133: gate line, 134: source driver, 134a: source driver, 134b: source driver, 135: source line, 136: pixel, 137: power supply line, 141: transistor, 142: transistor, 143: capacitor, 144: light-emitting element, 152: light-emitting layer, 153: electrode, 154: electrode, 155: light-blocking film, 161: substrate, 162: sealing material, 165: connection terminal, 166: wiring, 167a: FPC, 167b: FPC, 168: anisotropic conductive film, 169: filler This application is based on Japanese Patent Application serial no. 2010-207009 filed with Japan Patent Office on Sep. 15, 2010, the entire contents of which are hereby incorporated by reference.

What is claimed is:

1. A semiconductor device comprising:
a first gate electrode and a second gate electrode apart from each other over an insulating surface;
an oxide semiconductor film comprising a region overlapping with the first gate electrode with a gate insulating film interposed therebetween, a region overlapping with the second gate electrode with the gate insulating film interposed therebetween, and a region overlapping with neither the first gate electrode nor the second gate electrode;
one of a source electrode and a drain electrode overlapping with a part of the first gate electrode and a part of the oxide semiconductor film;
the other of the source electrode and the drain electrode overlapping with a part of the second gate electrode and a part of the oxide semiconductor film; and
an insulating film covering the gate insulating film, the first gate electrode, the second gate electrode, the oxide semiconductor film, the source electrode, and the drain electrode, the insulating film being in direct contact with the oxide semiconductor film.

2. The semiconductor device according to claim 1, wherein the source electrode and the drain electrode comprise a metal selected from aluminum, chromium, tantalum, titanium, molybdenum, and tungsten.

3. The semiconductor device according to claim 1, wherein the oxide semiconductor film comprises indium and zinc.

4. The semiconductor device according to claim 3, wherein the oxide semiconductor film further comprises gallium.

5. A semiconductor device comprising:
a first transistor over an insulating surface, the first transistor comprising:
a first gate electrode and a second gate electrode apart from each other over the insulating surface;
a first oxide semiconductor film comprising a region overlapping with the first gate electrode with a gate insulating film interposed therebetween, a region overlapping with the second gate electrode with the gate insulating film interposed therebetween, and a region overlapping with neither the first gate electrode nor the second gate electrode;

one of a first source electrode and a first drain electrode overlapping with a part of the first gate electrode and a part of the first oxide semiconductor film;

the other of the first source electrode and the first drain electrode overlapping with a part of the second gate electrode and a part of the first oxide semiconductor film; and an insulating film covering the gate insulating film, the first gate electrode, the second gate electrode, the first oxide semiconductor film, the first source electrode, and the first drain electrode, the insulating film being in direct contact with the first oxide semiconductor film, and a second transistor over the insulating surface, the second transistor comprising:

a third gate electrode over the insulating surface;

a second oxide semiconductor film overlapping with the third gate electrode with the gate insulating film interposed therebetween;

a second source electrode overlapping with a part of the third gate electrode and a part of the second oxide semiconductor film;

a second drain electrode overlapping with a part of the third gate electrode and a part of the second oxide semiconductor film; and the insulating film covering the gate insulating film, the third gate electrode, the second oxide semiconductor film, the second source electrode, and the second drain electrode, the insulating film being in direct contact with the second oxide semiconductor film.

6. The semiconductor device according to claim 5, wherein the first source electrode, the first drain electrode, the second source electrode, and the second drain electrode comprise a metal selected from aluminum, chromium, tantalum, titanium, molybdenum, and tungsten.

7. The semiconductor device according to claim 5, wherein the first oxide semiconductor film and the second oxide semiconductor film comprise indium and zinc.

8. The semiconductor device according to claim 7, wherein the first oxide semiconductor film and the second oxide semiconductor film further comprise gallium.

9. A display device comprising:

a pixel portion comprising a plurality of pixels over an insulating surface, each of the plurality of pixels comprising:

a first transistor over an insulating surface, the first transistor comprising:

a first gate electrode and a second gate electrode apart from each other over the insulating surface;

a first oxide semiconductor film comprising a region overlapping with the first gate electrode with a gate insulating film interposed therebetween, a region overlapping with the second gate electrode with the gate insulating film interposed therebetween, and a region overlapping with neither the first gate electrode nor the second gate electrode;

one of a first source electrode and a first drain electrode overlapping with a part of the first gate electrode and a part of the first oxide semiconductor film;

the other of the first source electrode and the first drain electrode overlapping with a part of the second gate electrode and a part of the first oxide semiconductor film; and a first insulating film covering the gate insulating film, the first gate electrode, the second gate electrode, the first oxide semiconductor film, the first source electrode, and the first drain electrode, the first insulating film being in direct contact with the first oxide semiconductor film;

a second insulating film over the first transistor; and a light-emitting element over the second insulating film.

10. The display device according to claim 9, wherein the first source electrode and the first drain electrode comprise a metal selected from aluminum, chromium, tantalum, titanium, molybdenum, and tungsten.

11. The display device according to claim 9, wherein the first oxide semiconductor film comprises indium and zinc.

12. The semiconductor device according to claim 11, wherein the first oxide semiconductor film further comprises gallium.

13. The display device according to claim 9, further comprising a driver circuit, the driver circuit comprising:

a second transistor over an insulating surface, the second transistor comprising:

a third gate electrode over the insulating surface;

a second oxide semiconductor film overlapping with the third gate electrode with the gate insulating film interposed therebetween;

a second source electrode overlapping with a part of the third gate electrode and a part of the second oxide semiconductor film;

a second drain electrode overlapping with a part of the third gate electrode and a part of the second oxide semiconductor film; and the first insulating film covering the gate insulating film, the third gate electrode, the second oxide semiconductor film, the second source electrode, and the second drain electrode, the first insulating film being in direct contact with the second oxide semiconductor film.

14. The display device according to claim 13, wherein the driver circuit is a source driver or a gate driver.

15. The display device according to claim 13, wherein the first source electrode, the first drain electrode, the second source electrode, and the second drain electrode comprise a metal selected from aluminum, chromium, tantalum, titanium, molybdenum, and tungsten.

16. The display device according to claim 13, wherein the first oxide semiconductor film and the second oxide semiconductor film comprise indium and zinc.

17. The semiconductor device according to claim 16, wherein the first oxide semiconductor film and the second oxide semiconductor film further comprise gallium.

* * * * *